(12) United States Patent
Camardello et al.

(10) Patent No.: US 12,215,265 B2
(45) Date of Patent: Feb. 4, 2025

(54) GREEN-EMITTING PHOSPHORS AND DEVICES THEREOF

(71) Applicant: Dolby Intellectual Property Licensing, LLC, Niskayuna, NY (US)

(72) Inventors: Samuel Joseph Camardello, Ballston Spa, NY (US); Matthew David Butts, Rexford, NY (US); Anant A. Setlur, Niskayuna, NY (US)

(73) Assignee: Dolby Intellectual Property Licensing, LLC, Niskayuna, NY (US)

( * ) Notice: Subject to any disclaimer, the term of this patent is extended or adjusted under 35 U.S.C. 154(b) by 0 days.

(21) Appl. No.: 17/919,180

(22) PCT Filed: Apr. 13, 2021

(86) PCT No.: PCT/US2021/027105
§ 371 (c)(1),
(2) Date: Oct. 14, 2022

(87) PCT Pub. No.: WO2021/211600
PCT Pub. Date: Oct. 21, 2021

(65) Prior Publication Data
US 2023/0159824 A1    May 25, 2023

Related U.S. Application Data

(60) Provisional application No. 63/073,391, filed on Sep. 1, 2020, provisional application No. 63/009,800, filed on Apr. 14, 2020.

(51) Int. Cl.
*C09K 11/77* (2006.01)
*C09K 11/61* (2006.01)
*H01L 33/50* (2010.01)

(52) U.S. Cl.
CPC .......... *C09K 11/771* (2013.01); *C09K 11/616* (2013.01); *C09K 11/7708* (2013.01);
(Continued)

(58) Field of Classification Search
CPC ............ C09K 11/7708; C09K 11/7734; C09K 11/7738
(Continued)

(56) References Cited

U.S. PATENT DOCUMENTS 3,252,613 A    5/1966    Mcgrath
3,457,179 A    7/1969    Natansohn
(Continued)

FOREIGN PATENT DOCUMENTS

CN    102220131 A    10/2011
CN    113025329 A    6/2021
(Continued)

OTHER PUBLICATIONS

Vochten, R. F. et al. "Transformation of chernikovite into meta-uranocircite II, Ba(U02)2(P04)2.6H20 and study of its solubility", Mineralogical Maganize, Sep. 1992, vol. 56, pp. 367-372 A abstract; p. 368.
(Continued)

*Primary Examiner* — Christopher M Raabe
(74) *Attorney, Agent, or Firm* — Armstrong Teasdale LLP

(57) ABSTRACT

Green-emitting phosphors are useful in devices including an LED light source radiationally coupled and/or optically coupled to the phosphors, which are selected from $[Ba_{1-a-b}Sr_aCa_b]_x[Mg,Zn]_y(UO_2)_z([P,V]O_4)_{2(x+y+z)/3}$, where $0 \le a \le 1$, $0 \le b \le 1$, $0.75 \le x \le 1.25$, $0.75 \le y \le 1.25$, $0.75 \le z \le 1.25$; and $[Ba,Sr,Ca,Mg,Zn]_p(UO_2)_q[P,V]_rO_{(2p+2q+5r)/2}$, where $2.5 \le p \le 3.5$, $1.75 \le q \le 2.25$, $3.5 \le r \le 4.5$.

20 Claims, 17 Drawing Sheets

(52) U.S. Cl.
CPC ...... *C09K 11/7734* (2013.01); *C09K 11/7738* (2013.01); *H01L 33/504* (2013.01)

(58) Field of Classification Search
USPC .................................................. 252/301.4 P
See application file for complete search history.

(56) References Cited

U.S. PATENT DOCUMENTS

| | | | |
|---|---|---|---|
| 3,509,064 | A | 4/1970 | Natansohn |
| 3,576,756 | A | 4/1971 | Russo |
| 3,586,634 | A | 6/1971 | Avella |
| 5,917,935 | A | 6/1999 | Hawthorne et al. |
| 5,953,678 | A | 9/1999 | Genet |
| 7,358,542 | B2 | 4/2008 | Radkov et al. |
| 7,497,973 | B2 | 3/2009 | Radkov et al. |
| 7,648,649 | B2 | 1/2010 | Radkov et al. |
| 7,655,156 | B2 | 2/2010 | Cheng et al. |
| 7,985,723 | B2 | 7/2011 | Savu et al. |
| 8,252,613 | B1 | 8/2012 | Lyons et al. |
| 8,329,485 | B2 | 12/2012 | McKean |
| 8,663,501 | B2 | 3/2014 | Srivastava et al. |
| 8,721,925 | B2 | 5/2014 | Winkler et al. |
| 8,785,222 | B2 | 7/2014 | McKean et al. |
| 8,906,724 | B2 | 12/2014 | Murphy et al. |
| 9,111,464 | B2 | 8/2015 | Bibl et al. |
| 9,222,017 | B2 | 12/2015 | Yoshida |
| 9,388,336 | B2 | 7/2016 | Murphy et al. |
| 9,512,356 | B2 | 12/2016 | Lyons et al. |
| 9,598,636 | B2 | 3/2017 | Kaneyoshi et al. |
| 9,627,437 | B1 | 4/2017 | Ulmer et al. |
| 9,698,314 | B2 | 7/2017 | Murphy et al. |
| 9,879,178 | B2 | 1/2018 | Jin et al. |
| 10,020,430 | B2 | 7/2018 | Nguyen et al. |
| 10,424,614 | B2 | 9/2019 | Schubert et al. |
| 10,600,939 | B2 | 3/2020 | Yuan et al. |
| 10,793,773 | B2 | 10/2020 | Du et al. |
| 2002/0195927 | A1 | 12/2002 | Groen et al. |
| 2003/0148695 | A1 | 8/2003 | Kawamura et al. |
| 2004/0144987 | A1 | 7/2004 | Ouderkirk et al. |
| 2004/0164277 | A1 | 8/2004 | Yen et al. |
| 2006/0012287 | A1 | 1/2006 | Tian et al. |
| 2007/0159060 | A1 | 7/2007 | Shimizu |
| 2008/0111472 | A1 | 5/2008 | Liu et al. |
| 2009/0267485 | A1 | 10/2009 | Nagatomi et al. |
| 2009/0272996 | A1 | 11/2009 | Chakraborty |
| 2010/0142189 | A1 | 6/2010 | Hong et al. |
| 2010/0148193 | A1 | 6/2010 | Duong et al. |
| 2012/0064134 | A1 | 3/2012 | Bourke, Jr. et al. |
| 2012/0256125 | A1 | 10/2012 | Kaneyoshi et al. |
| 2012/0286208 | A1 | 11/2012 | McKean et al. |
| 2013/0130419 | A1 | 5/2013 | Phipps |
| 2013/0148376 | A1 | 6/2013 | Nick et al. |
| 2014/0027673 | A1 | 1/2014 | Nick et al. |
| 2014/0120705 | A1* | 5/2014 | Rogojina ............ H01L 21/2225 438/542 |
| 2014/0339495 | A1 | 11/2014 | Bibl et al. |
| 2015/0008463 | A1 | 1/2015 | Yoshida |
| 2015/0076406 | A1 | 3/2015 | Zhou et al. |
| 2015/0301402 | A1 | 10/2015 | Kimura et al. |
| 2015/0329770 | A1 | 11/2015 | Kaneyoshi et al. |
| 2016/0024378 | A1 | 1/2016 | Murphy |
| 2016/0053170 | A1 | 2/2016 | Okura et al. |
| 2016/0244663 | A1 | 8/2016 | Murphy et al. |
| 2016/0289553 | A1 | 10/2016 | Beers et al. |
| 2016/0312114 | A1 | 10/2016 | Murphy et al. |
| 2016/0347998 | A1 | 12/2016 | Kaneyoshi |
| 2017/0073815 | A1 | 3/2017 | Patel et al. |
| 2017/0077360 | A1 | 3/2017 | Yang et al. |
| 2017/0130125 | A1 | 5/2017 | Shibamoto et al. |
| 2017/0153382 | A1 | 6/2017 | Wang et al. |
| 2017/0219184 | A1 | 8/2017 | Petluri |
| 2017/0242303 | A1 | 8/2017 | Meyers |
| 2017/0254943 | A1 | 9/2017 | Murphy |
| 2017/0276997 | A1 | 9/2017 | Yoshinaga |
| 2017/0329770 | A1 | 11/2017 | Kozak et al. |
| 2017/0342278 | A1 | 11/2017 | Zalich et al. |
| 2017/0342320 | A1 | 11/2017 | Tsumori et al. |
| 2018/0163126 | A1 | 6/2018 | Murphy et al. |
| 2018/0190827 | A1 | 7/2018 | Okazaki et al. |
| 2018/0208787 | A1 | 7/2018 | Tateishi et al. |
| 2018/0233632 | A1 | 8/2018 | Yuan et al. |
| 2018/0252967 | A1 | 9/2018 | Li et al. |
| 2018/0265778 | A1 | 9/2018 | Du et al. |
| 2019/0018273 | A1 | 1/2019 | Park et al. |
| 2019/0088827 | A1 | 3/2019 | Camardello et al. |
| 2019/0179016 | A1 | 6/2019 | Raring et al. |
| 2019/0280165 | A1 | 9/2019 | Camardello et al. |
| 2019/0292448 | A1 | 9/2019 | Porob et al. |
| 2019/0366847 | A1 | 12/2019 | Meyers |
| 2020/0028033 | A1 | 1/2020 | Camardello et al. |
| 2020/0287099 | A1 | 9/2020 | Camardello et al. |
| 2020/0299574 | A1 | 9/2020 | Hashizume |
| 2020/0301261 | A1 | 9/2020 | Hashizume |
| 2020/0304764 | A1 | 9/2020 | Hashizume |
| 2020/0369956 | A1 | 11/2020 | Butts et al. |
| 2023/0246013 | A1 | 8/2023 | Murphy |

FOREIGN PATENT DOCUMENTS

| | | |
|---|---|---|
| DE | 2523933 A1 | 12/1976 |
| EP | 3045965 A1 | 7/2016 |
| GB | 1174380 A | 12/1969 |
| JP | 2003336045 A | 11/2003 |
| JP | 5375733 B2 | 12/2013 |
| JP | 5884717 B2 | 3/2016 |
| KR | 20010004094 A | 1/2001 |
| TW | 200930793 A | 7/2009 |
| TW | 201727336 A | 8/2017 |
| TW | 201921731 A | 6/2019 |
| WO | 2010074963 A1 | 7/2010 |
| WO | 2013121355 A1 | 8/2013 |
| WO | 2014146748 A1 | 9/2014 |
| WO | 2016186637 A1 | 11/2016 |
| WO | 2017073815 A1 | 5/2017 |
| WO | 2018093832 A2 | 5/2018 |
| WO | 2018185116 A2 | 10/2018 |
| WO | 2018190827 A1 | 10/2018 |
| WO | 2019173025 A1 | 9/2019 |
| WO | 2021211600 A1 | 10/2021 |

OTHER PUBLICATIONS

International Search Report and Written Opinion for International Application No. PCT/US2021/027105, dated Jul. 30, 2021, 10 pages.

Alekseev, Evgeny V. et al., 'Complex topology of uranyl polyphosphate frameworks: crystal structures of α-, β-K [(UO2)(P3O9)] and K[(UO2)2(P3O10)].' Z. Anorg. Allg. Chem., Jun. 10, 2008, vol. 634, No. 9, pp. 1527-1532.

Allpress "The crystal structure of caesium uranyl oxychloride Csx(UO2)OClx (x approximately 0.9)", Published 1964 in "Acta Crystallographica", 17, 41-46 (Year: 1964).

Anonymous, "Compreignactie ", (Aug. 11, 2016), pp. 1-3, fluomin, URL: http://www.fluomin.org/uk/fiche.php?id=1008, XP055738271.

Anonymous, "Renardite", (Aug. 12, 2016), pp. 1-2, fluomin, URL: http://www.fluomin.org/uk/fiche.php?id=868&name=renardite, XP055738269.

Anonymous, "Dumontite", (Aug. 12, 2016), pp. 1-2, fluomin, URL: http://www.fluomin.org/uk/fiche.php?id=325, XP055738275.

Anonymous, "Sodium-zippeite ", (Aug. 11, 2016), pp. 1-3, fluomin, URL: http://www.fluomin.org/uk/fiche.php?id=674, XP055738273.

Braun, David D. et al., "Rheology Modifiers Handbook: Practical Use and Application", Part 2, pp. 71-191, Elsevier, 2013 (ISBN:0-8155-1441-7).

Cai, Xing-Wei et al., "Lead-free/rare earth-free Green-light-emitting crystal based on organic-inorganic hybrid [(C10H16N)2][MnBr4] with high emissive quantum yields and large crystal size", Journal of Molecular Structure, vol. 1161, 2018, pp. 262-266, ISSN 0022-2860, https://doi.org/10.1016/j.molstruc.2018.01.093.

(56) References Cited

OTHER PUBLICATIONS

Chukanov et al., "Chistyakovaite, a new mineral Al(UO2)2(AsO4)2(F,OH) • 6.5H2O", Doklady Earth Sciences, (Feb. 28, 2006), vol. 407, No. 2, ISSN 1531-8354, pp. 290-293, XP019316270.

Chukanov et al., "Larisaite, Na(H3O)(UO2)3(SeO3)2O2-4H20, a new uranyl selenite mineral from Repete mine, San Juan County, Utah, USA", European Journal of Mineralogy, (Jan. 1, 2004), vol. 16, No. 2, doi:10.1127/0935-1221/2004/0016-0367, ISSN 0935-1221, pp. 367-374, XP055738278.

Derby, Brian, "Inkjet Printing Ceramics: From Drops to Solid", 2011, Journal of The European Ceramic Society—J Eur Ceram Soc, 31, 2543-2550, 10.1016/j.jeurceramsoc.2011.01.016.

Gong, Liaokuo et al., "Efficient modulation of photoluminescence by hydrogen bonding interactions among inorganic [MnBr4]2- anions and organic cations", 2019, Chemical Communications, 55 (51), 10.1039/C9CC03038G.

Gough et al., "Multi-Photon Phosphor Feasibility Research", Advanced Light Source Development U.S. Dept. of Energy Contract with EPRI: DE-FC26-00NT40987 Reporting Period Oct. 1, 2000 to Mar. 31, 2002; Final Report, May 2003.

Huang et al., "Highly stable K2SiF6: Mn4+K2SiF6 composite phosphor with narrow red emission for white LEDs.", ACS applied materials & interfaces, 2018, vol. 10, No. 21, pp. 18082-18092, <doi:10.1021/acsami.8b03893>.

International Search Report and Written Opinion for International Application No. PCT/US2022/024577, dated Mar. 8, 2022, 9 pages.

International Search Report and Written Opinion of the International Searching Authority, PCT/US2019/017606, May 27, 2019.

International Search Report and Written Opinion of the International Searching Authority, PCT/US2020/028946, Aug. 10, 2020.

International Search Report and Written Opinion of the International Searching Authority, PCT/US2021/013963, May 12, 2021.

International Search Report and Written Opinion of the International Searching Authority, PCT/US2021/027105 dated Jul. 30, 2021.

International Search Report and Written Opinion of the International Searching, Authority, dated Dec. 21, 2021 for International Application No. PCT/US2021/048535.

Kikuyama et al., Surface Active Buffered Hydrogen Fluoride Having Excellent Wettability for ULSI Processing, IEEE Transactions on Semiconductor Manufacturing, vol. 3, No. 3, Aug. 1990, pp. 99-108.

Kumar et al., "On the photo and thermally stimulated luminescence properties of U doped SrBPO5", Materials Research Bulletin, vol. 60, Dec. 2014, 7 Pages.

Lee, Ernest et al., "Quantum Dot Conversion Layers Through Inkjet Printing", Nanosys, Inc., Milpitas, CA, May 21, 2018, 4 pages.

Liu, Yuanyuan et al., "Experimental study of the parameters for stable drop-on-demand inkjet performance", Physics of Fluids, 31, 032004 (2019) https://doi.org/10.1063/1.5085868.

M. V. Hoffman, "Fluorescence and Energy Transfer in SrZnP2 07. UO2", J. Electrochem. Soc.: Solid State Science, Feb. 1970, No. 2, vol. 117, 6 Pages.

Mao, Wenhui et al., "Synthesis, crystal structure, photoluminescence properties of organic-inorganic hybrid materials based on ethylenediamine bromide", Journal of Saudi Chemical Society, vol. 24, Issue 1, 2020, pp. 52-60, ISSN 1319-6103, https://doi.org/10.1016/j.jscs.2019.09.003.

Mikolajek, Morten et al., "Requirements to Ceramic Suspensions for Inkjet Printing", 2015, Ceramic Forum International, 92, E25-29.

Morad, Viktoriia et al., "Manganese(II) in Tetrahedral Halide Environment: Factors Governing Bright Green uminescence", Chemistry of Materials, 2019, 31 (24), 10161-10169, DOI: 10.1021/acs.chemmater.9b03782.

Morrison et al., "Flux versus Hydrothermal Growth: Polymorphism of A2(UO2)Si2O6 (A=Rb, Cs)", Inorganic chemistry, 2017, vol. 56, pp. 1053-1056.

Nguyen et al., "Waterproof Alkyl Phosphate Coated Fluoride Phosphors for Optoelectronic Materials", Angewandte Communications, International Edition vol. 54, 2015, pp. 10865-10866.

Nichols et al., "Fluorescence of the Uranyl Salts", Published in 1919 by The Carnegie Institution of Washington (Year: 1919).

Non-final Office Action dated May 12, 2021 for related application U.S. Appl. No. 17/152,751.

Onac et al., "Hydrothermal Genesis of Metatyuyamunite, Ca(UO2)2(VO4)2•3-5H2O in the Valea Rea Cave, Romania", 13th International Congress of Speleology 4th Speleological Congress of Latin América and Caribbean 26th Brazilian Congress of Speleology, (Jul. 22, 2001), pp. 25-30, XP055637609.

Ondruš et al., "Cejkaite, the triclinic polymorph of Na4(UO2)(CO3)3—A new mineral from Jachymov, Czech Republic", American Mineralogist, (Apr. 31, 2003), vol. 88, No. 4, doi:10.2138/am-2003-0422, ISSN 0003-004X, pp. 686-693, XP055637612.

Pekov et al., "Beshtauite, (NH4)2(UO2)(SO4)2 . 2H20, a new mineral from Mount Beshtau, Northern Caucasus, Russia", American Mineralogist, (Aug. 31, 2014), vol. 99, No. 8-9, doi:10.2138/am.2014.4870OLITCiteNPL, ISSN 0003-004X, pp. 1783-1787, XP009523386.

Phosphor Film—Contribute to High Efficiency and Thinner Liquid Crystal Display with Backlight Using Mini LED, White Paper for PS Series, dated Sep. 2022.

Plasil et al., "Adolfpateraite, K(UO2)(SO4)(OH)(H2O), a new uranyl sulphate mineral from Jachymov", American Mineralogist, Czech Republic, (2012), vol. 97, No. 2-3, doi: 10.2138/am.2012.3976, pp. 447-454, XP009523379.

Pote et al., "Preparation of CaF2: U Phosphor by Solid State Metathesis Reaction", International Journal of Self- Propagating High-Temperature Synthesis, 2013, vol. 22, No. 1, pp. 37-40.

Pro Display XDR Technology Overview, White Paper, dated Feb. 2020.

Qin, Yanyan et al., "Luminescent manganese(II) complexes: Synthesis, properties and optoelectronic applications", Coordination Chemistry Reviews, vol. 416, 2020, 213331, ISSN 0010-8545, https://doi.org/10.1016/j.ccr.2020.213331.

Rabinowitch, "Spectroscopy and Photochemistry of Uranyl Compounds", Published Jan. 1, 1964, 1st Edition, The MacMillian Company, New York, pp. 47, 57, & 58 (Year: 1964).

Read et al., "Crystal growth, structural characterization, cation-cation interaction classification, and optical properties of uranium(VI) containing oxychlorides, A4U5O16Cl2 (A=K, Rb), Cs5U7O22Cl3, and AUO3Cl (A=Rb, Cs)", Published Apr. 7, 2014 in "CrystEngComm", 2014, 16, 7259-7267.

Read, Cory Michael, "Discovery of novel uranium-containing oxides and related materials by flux crystal growth", University of South Carolina 2015, pp. 1-258.

Rout et al., "Uranium speciation and its site occupancy in alkaline-earth borophosphates", Journal of the American Ceramic Society, vol. 100, No. 7, Apr. 3, 2017 (Apr. 3, 2017), pp. 2921-2931, XP055810229, ISSN: 0002-7820, DOI: 10.1111/jace.14800, Retrieved from the internet: URL: https://api.wiley.com/onlinelibrary/tdm/v1/articles/10.1111%2Fjace.14800>.

"Sijbom et al., ""K_2SiF_6:Mn4+ as a red phosphor for displays and warm-white LEDs: a review of properties and perspectives"", Optical Materials Express, vol. 7, No. 9, Aug. 24, 2017 (Aug. 24, 2017), pp. 3332-3365, XP055810315, DOI: DirectPDFAccess/32562ED4-D5B4-A705-8BEB3A3D3B44F39F_371019/0me-7-9-3332.pdf?da=1&id=371019&seq=0&mobile=no>".

Slattery, "Uranium as an Activator-II", Published in 1929 by Journal of the Optical Society of America, vol. 19, Issue 4, pp. 175-186 (Year: 1929).

Taikar et al., "SrO: U6+ green light emitting phosphor", Journal of Luminescence, Elsevier, Science direct, 153, 2014, pp. 304-306.

Worku, Michael et al., "Sunlike White-Light-Emitting Diodes Based on Zero-Dimensional Organic Metal Halide Hybrids", ACS Applied Materials & Interfaces, 2018, 10 (36), 30051-30057, DOI: 10.1021/acsami.8b12474.

Wu, Yuying et al., "New photoluminescence hybrid perovskites with ultrahigh photoluminescence quantum yield and ultrahigh

(56) References Cited

OTHER PUBLICATIONS thermostability temperature up to 600 K", Nano Energy, vol. 77, 2020, 105170, ISSN 2211-2855, https://doi.org/10.1016/j.nanoen.2020.105170.
Zhou, Tingting et al., "P-92: Fabrication and Patterning of a Wide-Color-Gamut Color Filter Based on Quantum Dots", 2016, SID Symposium Digest of Technical Papers, 47, 1469-1471, 10.1002/sdtp.10945.
Luminescence of Barium Uranyl Phosphate, G. Blasse et al., J.Inorg.Nucl. Chem., vol. 40, pp. 2037-2039.
Chinese Office Action dated Aug. 1, 2023 for CN App. No. 202180042076.9 (pp. 1-16).
Ji Hye Oh et al., "Analysis of wide color gamut of green/red bilayered freestanding phosphor film-capped white LEDs for LCD backlight", Optics Express, Jun. 4, 2015, pp. 1-14.
Ziyang Hou et al., "A Green synthetic route to the highly efficient $K_2SiF_6$: $Mn^{4+}$ narrow-band red phosphor for warm white light-emitting diodes", Journal of Materials Chemistry C, vol. 6, No. 11, Jan. 1, 2018, pp. 2741-2746.
Douglas Naab et al., "GE $K_2SiF_6$: $Mn^{4+}$ (PFS/KSF) Phosphor: Market Leading Wide Color Gamut Technology & Path Towards Enabling Next Generation Displays", May 5, 2019, pp. 1-13.
EP Third Party Submission, Publication No. Application No. 20210788285, dated Nov. 20, 2023, 5 pps.
PCT International Search Report, Application No. PCT/US2022/024577, dated Aug. 3, 2022, 5 pages.
Taiwanese Office Action dated Apr. 30, 2024 for TW App. No. 110113479 (pp. 1-12).
Shijun Wu et al, High Distorted Uranyl Ion Coordination and One/Two-Dimensional Structural Relationship in the $Ba_2[UO_2(TO_4)_2]$ (T=P, As) System: An Experimental and Computational Study, Inorganic Chemistry, Jul. 3, 2014, vol. 53, pp. 7650-7660.
Murphy, James, "GE TriGain (TM): Commercialized, Narrow Band, Red Emitting Phosphors for LED Lighting and WCG Display Applications" Presentation, SID 2017; 19 pp.
Murphy, James, "GE RadiantRed (TM) Technology & TriGain (TM) Phosphors for Wide Color Gamut Displays" Presentation, SID 2018; 12 pp.
Murphy, James, "Market Leading Wide Color Gamut, Narrow-Band Phosphors by GE & Path Towards Enabling Next Generation Displays" Presentation, SID 2020; 26 pp.
PCT International Search Report, Application No. PCT/US2022/077858, dated Feb. 7, 2023, 13 pages.

\* cited by examiner

GREEN-EMITTING PHOSPHORS AND DEVICES THEREOF

CROSS REFERENCE TO RELATED APPLICATIONS

This application is a national phase of International Application No. PCT/US2021/027105 filed Apr. 13, 2021, which claims the priority benefit of U.S. Provisional Patent Application Ser. No. 63/009,800 filed Apr. 14, 2020 for "GREEN-EMITTING PHOSPHORS AND DEVICES THEREOF"; and of U.S. Provisional Patent Application Ser. No. 63/073,391 filed Sep. 1, 2020 for "GREEN-EMITTING PHOSPHORS AND DEVICES THEREOF", each of which is hereby incorporated by reference in its entirety.

BACKGROUND

The subject matter described herein relates generally to phosphors and devices, and more particularly, to green-emitting phosphors.

Current display device technology relies on liquid crystal displays (LCDs), which is one of the most widely used flat panel displays for industrial and residential applications. However, next-generation devices will have low energy consumption, compact size, and high brightness, requiring improved color gamut.

LED packages for use in displays are based on a combination of a blue LED, a green phosphor and a red phosphor. The color gamut is largely determined by the choice of phosphors. Red phosphor $K_2SiF_6:Mn^{4+}$ has a peak characterized by a full width at half maximum (FWHM) of 6 to 8 nm and yields high color reproducibility in correspondence with the relative intensity of the emission peak. Green phosphor, $\beta$-SiAlON: $Eu^{2+}$ has a full width at half maximum of 46 to 52 nm and has a peak wavelength of 534 to 540 nm, which is not a pure green but rather is greenish yellow in color. Accordingly, there is also a need for new green-emitting phosphors that efficiently absorb blue radiation, provide high quantum efficiency, and have improved color rendering.

BRIEF DESCRIPTION

Briefly, in one aspect, green-emitting phosphors are provided. The green-emitting phosphors are selected from $[Ba_{1-a-b}Sr_aCa_b]_x[Mg,Zn]_y(UO_2)_z([P,V]O_4)_{2(x+y+z)}/3$, where $0 \leq a \leq 1$, $0 \leq b \leq 1$, $0.75 \leq x \leq 1.25$, $0.75 \leq y \leq 1.25$, and $0.75 \leq z \leq 1.25$; and $[Ba,Sr,Ca,Mg,Zn]_p(UO_2)_q[P,V]_rO_{(2p+2q+5r)/2}$, where $2.5 \leq p \leq 3.5$, $1.75 \leq q \leq 2.25$, and $3.5 \leq r \leq 4.5$.

In another aspect, a phosphor composition is provided. The phosphor composition comprises a green-emitting phosphor and a red-emitting phosphor; wherein the green-emitting phosphor is selected from $[Ba_{1-a-b}Sr_aCa_b]_x[Mg,Zn]_y(UO_2)_z([P,V]O_4)_{2(x+y+z)}/3$, where $0 \leq a \leq 1$, $0 \leq b \leq 1$, $0.75 \leq x \leq 1.25$, $0.75 \leq y \leq 1.25$, and $0.75 \leq z \leq 1.25$; and $[Ba,Sr,Ca,Mg,Zn]_p(UO_2)_q[P,V]_rO_{(2p+2q+5r)/2}$, where $2.5 \leq p \leq 3.5$, $1.75 \leq q \leq 2.25$, and $3.5 \leq r \leq 4.5$; and the red-emitting phosphor is selected from $[Ba,Sr,Ca]_2Si_5N_8:Eu^{2+}$; $[Ca,Sr]AlSiN_3:Eu^{2+}$; $[Ba,Sr,Ca]LiAl_3N_4:Eu^{2+}$; $[Sr,Ca,Mg]S:Eu^{2+}$; and a phosphor of formula I: $A_xMF_y:Mn^{4+}$ (I), wherein A is Li, Na, K, Rb, Cs, or a combination thereof; M is Si, Ge, Sn, Ti, Zr, Al, Ga, In, Sc, Hf, Y, La, Nb, Ta, Bi, Gd, or a combination thereof; x is an absolute value of a charge of the $MF_y$ ion; and y is 5, 6 or 7.

In yet another aspect, devices including an LED light source radiationally and/or optically coupled to a green-emitting phosphor are provided. The green-emitting phosphor is selected from $[Ba_{1-a-b}Sr_aCa_b]_x[Mg,Zn]_y(UO_2)_z([P,V]O_4)_{2(x+y+z)}/3$, where $0 \leq a \leq 1$, $0 \leq b \leq 1$, $0.75 \leq x \leq 1.25$, $0.75 \leq y \leq 1.25$, $0.75 \leq z \leq 1.25$; and $[Ba,Sr,Ca,Mg,Zn]_p(UO_2)_q[P,V]_rO_{(2p+2q+5r)/2}$, where $2.5 \leq p \leq 3.5$, $1.75 \leq q \leq 2.25$, and $3.5 \leq r \leq 4.5$.

DRAWINGS

These and other features, aspects, and advantages of the present disclosure will become better understood when the following detailed description is read with reference to the accompanying drawings in which like characters represent like parts throughout the drawings, wherein.

Figure 1:
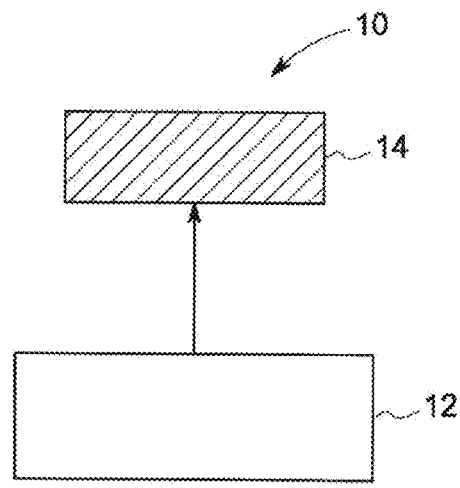
FIG. 1 is a schematic cross-sectional view of a device, in accordance with one embodiment of the disclosure.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. All references are incorporated herein by reference.

Square brackets in the formulas indicate that at least one of the elements within the brackets is present in the phosphor material, and any combination of two or more thereof may be present, as limited by the stoichiometry of the composition. For example, the formula $[Ca,Sr,Ba]_3MgSi_2O_8:Eu^{2+}$, $Mn^{2+}$ encompasses at least one of Ca, Sr or Ba or any combination of two or more of Ca, Sr or Ba. Examples include $Ca_3MgSi_2O_8:Eu^{2+},Mn^{2+}$; $Sr_3MgSi_2O_8:Eu^{2+},Mn^{2+}$; or $Ba_3MgSi_2O_8:Eu^{2+},Mn^{2+}$. Formula with an activator after a colon ":" indicates that the phosphor composition is doped with the activator. Formula showing more than one activator separated by a "," after a colon ":" indicates that the phosphor composition is doped with either activator or both activators. For example, the formula $[Ca,Sr,Ba]_3MgSi_2O_8:Eu^{2+},Mn^{2+}$ encompasses $[Ca,Sr,Ba]_3MgSi_2O_8:Eu^{2+}$, $[Ca,Sr,Ba]_3MgSi_2O_8:Mn^{2+}$ or $[Ca,Sr,Ba]_3MgSi_2O_8:Eu^{2+}$ and $Mn^{2+}$.

The green-emitting phosphors of the present disclosure absorb radiation in the near-UV or blue region (a wavelength range between about 400 nm and 470 nm) and emit in a narrow band with a main emission peak centered at a wavelength range between 500 nm and 550 nm, particularly from about 510 nm to about 530 nm, and more particularly from about 515 nm to about 525 nm. These phosphors are useful in display applications. Gamut of a display incorporating the narrow band green-emitting phosphors, which may be measured according to NTSC, DCI-P3, Adobe, or BT2020 standards, may be significantly improved relative to phosphors that have a relatively wide-band emission.

In some embodiments, the phosphors contain phosphate/vanadate groups, and are of formula $[Ba_{1-a-b}Sr_aCa_b]_x[Mg,Zn]_y(UO_2)_z([P,V]O_4)_{2(x+y+z)/3}$, where $0 \leq a \leq 1$, $0 \leq b \leq 1$, $0.75 \leq x \leq 1.25$, $0.75 \leq y \leq 1.25$, $0.75 \leq z \leq 1.25$. In some embodiments, one or more additional activator ions may be present, such as $Mn^{2+}$, $Mn^{4+}$, $Ce^{3+}$, $Cr^{3+}$, $Eu^{2+}$ or $Eu^{3+}$. In particular, the phosphors contain phosphate groups, and are of formula $[Ba_x[Mg,Zn]_y(UO_2)_z[PO_4]_{2(x+y+z)/3}$. Particular examples include $Ba[Mg,Zn]UO_2(PO_4)_2$, and more particularly $BaMgUO_2(PO_4)_2$ and $BaZnUO_2(PO_4)_2$.

In other embodiments, the phosphors contain $[P,V]_2O_7$ groups in addition to phosphate/vanadate groups, and are of formula $[Ba,Sr,Ca,Mg,Zn]_p(UO_2)_q[P,V]_rO_{(2p+2q+5r)/2}$, where $2.5 \leq p \leq 3.5$, $1.75 \leq q \leq 2.25$, $3.5 \leq r \leq 4.5$. In some embodiments, one or more additional activator ions may be present, such as $Mn^{2+}$, $Mn^{4+}$, $Ce^{3+}$, $Cr^{3+}$, $Eu^{2+}$ or $Eu^{3+}$. In particular, the phosphors contain phosphate and pyrophosphate groups, and are of formula $Ba_p(UO_2)_qP_rO_{(2p+2q+5r)/2}$. Particular examples include $Ba_3(PO_4)_2(UO_2)_2P_2O_7$ and gamma-$Ba_2UO_2(PO_4)_2$ ($\gamma\text{-}Ba_2UO_2(PO_4)_2$).

In one embodiment, the phosphors may be $Ba_2Sr(PO_4)_2(UO_2)_2P_2O_7$, $BaMgUO_2(PO_4)_2$, $BaZnUO_2(PO_4)_2$, $Ba_3(PO_4)_2(UO_2)_2P_2O_7$, gamma-$Ba_2UO_2(PO_4)_2$, $BaSr_2(PO_4)_2(UO_2)_2P_2O_7$, $Sr_3(PO_4)_2(UO_2)_2P_2O_7$, $Ca_3(PO_4)_2(UO_2)_2P_2O_7$, $BaMg_2(PO_4)_2(UO_2)_2P_2O_7$, $Ba_2Mg(PO_4)_2(UO_2)_2P_2O_7$, $Ba_2UO_2(VO_4)_2$, or $\gamma\text{-}Ba_2UO_2(PO_4)_2:Eu^{3+}$.

The phosphors of the present disclosure may be characterized as uranium-doped or U-doped because the $U^{6+}$ ions are part of the emitting species. The term 'U-doped' typically indicates that a relatively small number of uranium atoms is substituted in the host lattice. In many compounds the uranium is present in the host lattice as the uranyl ion $(UO_2)^{2+}$. Because the uranyl ion is characterized by linear O—U—O bonding, there is typically an upper limit to the substitution that can be achieved, on the order of a few mole percent with respect to the site on which it is substituted. When substituting for a $M^{2+}$ ion there are size constraints between the $M^{2+}$ and the $(UO_2)^{2+}$ center that may create host lattice strain and/or compensating defects in the host lattice. As a result, concentration quenching of the $U^{6+}$ emission usually occurs before full substitution is achieved. In contrast, the phosphors of the present disclosure contain the $UO_2$ species as part of the host lattice and comprise uranyl ions at a concentration as high as about 40 mole % relative to the total number of moles of $M^{2+}$ cations present.

The phosphors of the present disclosure may be produced by firing a mixture of precursors under an oxidizing atmosphere. Non-limiting examples of suitable precursors include the appropriate metal oxides, hydroxides, alkoxides, carbonates, nitrates, aluminates, silicates, citrates, oxalates, carboxylates, tartarates, stearates, nitrites, peroxides, phosphates, pyrophosphates and combinations thereof. Suitable materials for use as precursors include, but are not limited to, $BaCO_3$, $BaHPO_4$, $Ba_3(PO_4)_2$, $Ba_2P_2O_7$, $Ba_2Zn(PO_4)_2$, $BaZnP_2O_7$, $Ba(OH)_2$, $Ba(C_2O_4)$, $Ba(C_2H_3O_2)_2$, $Ba_3(C_6H_5O_7)_2$, $Ba(NO_3)_2$, $CaCO_3$, $Eu_2O_3$, $Mg(C_2O_4)$, $Mg(C_2H_3O_2)_2$, $Mg(C_6H_6O_7)$, $MgCO_3$, $MgO$, $Mg(OH)_2$, $Mg_3(PO_4)_2$, $Mg_2P_2O_7$, $Mg_2Ba(PO_4)_2$, $MgHPO_4$, $Mg(NO_3)_2$, $NH_4MgPO_4$, $(NH_4)_2HPO_4$, $NH_4VO_3$, $SrCO_3$, $Zn(C_2O_4)$, $Zn(C_2H_3O_2)_2$, $Zn_3(C_6H_5O_7)_2$, $ZnCO_3$, $ZnO$, $Zn(OH)_2$, $Zn_3(PO_4)_2$, $Zn_2P_2O_7$, $Zn_2Ba(PO_4)_2$, $ZnHPO_4$, $Zn(NO_3)_2$, $NH_4ZnPO_4$, $UO_2$, $UO_2(NO_3)_2$, $(UO_2)_2P_2O_7$, $(UO_2)_3(PO_4)_2$, $NH_4(UO_2)PO_4$, $UO_2CO_3$, $UO_2(C_2H_3O_2)_2$, $UO_2(C_2O_4)$, $H(UO_2)PO_4$, $UO_2(OH)_2$, and $ZnUO_2(C_2H_3O_2)_4$, and various hydrates. For example, the exemplary phosphor $BaMgUO_2(PO_4)_2$ may be produced by mixing the appropriate amounts of $BaCO_3$, $MgO$, and $UO_2$ with the appropriate amount of $(NH_4)_2HPO_4$ and then firing the mixture under an air atmosphere. In another example, the exemplary gamma barium uranyl phosphate or gamma barium uranyl orthophosphate ($\gamma$-$Ba_2UO_2(PO_4)_2$) may be produced by mixing stochiometric amounts of $BaHPO_4$ and $UO_2$ with an excess of $(NH_4)_2HPO_4$ (DAP) and then firing the mixture under an air atmosphere. The precursors may be in solid form or in solution. Non-limiting examples of solvents include water, ethanol, acetone, and isopropanol, and suitability depends chiefly on solubility of the precursors in the solvent. After firing, the phosphor may be milled to break up any agglomerates that may have formed during the firing procedure.

The mixture of starting materials for producing the phosphor may also include one or more low melting temperature flux materials, such as boric acid, borate compounds such as lithium tetraborate, alkali phosphates, and combinations thereof. Non-limiting examples include $(NH_4)_2HPO_4$ (DAP). $Li_3PO_4$, $Na_3PO_4$, $NaBO_3$—$H_2O$, $Li_2B_4O_7$, $K_4P_2O_7$, $Na_4P_2O_7$, $H_3BO_3$, and $B_2O_3$. The flux may lower the firing temperature and/or firing time for the phosphor. If a flux is used, it may be desirable to wash the final phosphor product with a suitable solvent to remove any residual soluble impurities that may have originated from the flux.

The firing of the samples is generally done in air, but since the uranium is in its highest oxidation state ($U^{6+}$) it can also be fired in $O_2$ or other wet or dry oxidizing atmospheres, including at oxygen partial pressures above one atmosphere, at a temperature between about 900° C. and about 1300° C., particularly between about 1000° C. and about 1200° C., for a time sufficient to convert the mixture to the phosphor. The firing time required may range from about one to twenty hours, depending on the amount of the mixture being fired, the extent of contact between the solid and the gas of the atmosphere, and the degree of mixing while the mixture is fired or heated. The mixture may rapidly be brought to and held at the final temperature, or the mixture may be heated to the final temperature at a lower rate such as from about 2° C./minute to about 200° C./minute.

The phosphor compositions according to the present disclosure may include, in addition to the green-emitting phosphor, a red emitting phosphor of formula I: $A_xMF_y$:$Mn^{4+}$ (I), wherein A is Li, Na, K, Rb, Cs, or a combination thereof; M is Si, Ge, Sn, Ti, Zr, Al, Ga, In, Sc, Hf, Y, La, Nb, Ta, Bi, Gd, or a combination thereof; x is an absolute value of a charge of the $MF_y$ ion; and y is 5, 6 or 7. In one embodiment, the red emitting phosphor for formula I is $A_2(MF_6)$:$Mn^{4+}$, where A is Li, Na, K, Rb, Cs, or a combination thereof; and M is Si, Ge, Sn, Ti, Zr, Al, Ga, In, Sc, Hf, Y, La, Nb, Ta, Bi, Gd, or a combination thereof. In particular, the red emitting phosphor may be $K_2SiF_6$:$Mn^{4+}$. The red emitting phosphor of formula is radiationally and/or optically coupled to the LED light source. The phosphors of formula I are described in U.S. Pat. Nos. 7,497,973, and 8,906,724, and related patents assigned to the General Electric Company. Examples of the red emitting phosphors of formula I include, $K_2(TiF_6)$:$Mn^{4+}$, $K_2(SnF_6)$:$Mn^{4+}$, $Cs_2(TiF_6)$:$Mn^{4+}$, $Rb_2(TiF_6)$:$Mn^{4+}$, $Cs_2(SiF_6)$:$Mn^{4+}$, $Rb_2(SiF_6)$:$Mn^{4+}$, $Na_2(SiF_6)$:$Mn^{4+}$, $Na_2(TiF_6)$:$Mn^{4+}$, $Na_2(ZrF_6)$:$Mn^{4+}$, $K_3(ZrF_7)$:$Mn^{4+}$, $K_3(BiF_7)$:$Mn^{4+}$, $K_3(YF_7)$:$Mn^{4+}$, $K_3(LaF_7)$:$Mn^{4+}$, $K_3(GdF_7)$:$Mn^{4+}$, $K_3(NbF_7)$:$Mn^{4+}$ or $K_3(TaF_7)$:$Mn^{4+}$. In certain embodiments, the phosphor of formula I is $K_2SiF_6$:$Mn^{4+}$.

In addition to the green-emitting phosphor and, optionally, the red-emitting $Mn^{4+}$ doped phosphor of formula I, a phosphor composition according to the present disclosure may include one or more other luminescent materials. Additional luminescent materials such as blue, yellow, red, orange, or other color phosphors may be used in the phosphor composition to customize the white color of the resulting light and produce specific spectral power distributions.

Suitable phosphors for use in the phosphor composition, in addition to the green and red-emitting phosphors, include, but are not limited to: $((Sr_{1-z}[Ca,Ba,Mg,Zn]_z)_{1-(x+w)}[Li,Na,K,Rb]_wCe_x)_3(Al_{1-y}Si_y)O_{4+y+3(x-w)}F_{1-y-3(x-w)}$, $0 \leq x \leq 0.10$, $0 \leq y \leq 0.5$, $0 \leq z \leq 0.5$, $0 \leq w \leq x$; $[Ca,Ce]_3Sc_2Si_3O_{12}$ (CaSiG); $[Sr,Ca,Ba]_3Al_{1-x}Si_xO_{4+x}F_{1-x}$:$Ce^{3+}$ (SASOF)); $[Ba,Sr,Ca]_5(PO_4)_3[Cl,F,Br,OH]$:$Eu^{2+}$,$Mn^{2+}$; $[Ba,Sr,Ca]BPO_5$:$Eu^{2+}$,$Mn^{2+}$; $[Sr,Ca]_{10}(PO_4)_6$*$vB_2O_3$:$Eu^{2+}$ (wherein $0 \leq v \leq 1$); $Sr_2Si_3O_8$*$2SrCl_2$:$Eu^{2+}$; $[Ca,Sr,Ba]_3MgSi_2O_8$:$Eu^{2+}$,$Mn^{2+}$; $BaAl_8O_{13}$:$Eu^{2+}$; $2SrO$*$\mathbf{0.84}P_2O_5$*$0.16B_2O_3$:$Eu^{2+}$; $[Ba,Sr,Ca]MgAl_{10}O_{17}$:$Eu^{2+}$,$Mn^{2+}$; $[Ba,Sr,Ca]Al_2O_4$:$Eu^{2+}$; $[Y,Gd,Lu,Sc,La]BO_3$:$Ce^{3+}$,$Tb^{3+}$; $ZnS$:$Cu^+$,$Cl^-$; $ZnS$:$Cu^+$,$Al^{3+}$; $ZnS$:$Ag^+$,$Cl^-$; $ZnS$:$Ag^+$,$Al^{3+}$; $[Ba,Sr,Ca]_2Si_{1-n}O_{4-2n}$:$Eu^{2+}$ (wherein $0 \leq n \leq 0.2$); $[Ba,Sr,Ca]_2[Mg,Zn]Si_2O_7$:$Eu^{2+}$; $[Sr,Ca,Ba][Al,Ga,In]_2S_4$:$Eu^{2+}$; $[Y,Gd,Tb,La,Sm,Pr,Lu]_3[Al,Ga]_{5-a}O_{12-3/2a}$:$Ce^{3+}$ (wherein $0 \leq a \leq 0.5$); $[Ca,Sr]_8[Mg,Zn](SiO_4)_4Cl_2$:$Eu^{2+}$,$Mn^{2+}$; $Na_2Gd_2B_2O_7$:$Ce^{3+}$,$Tb^{3+}$; $[Sr,Ca,Ba,Mg,Zn]_2$ $P_2O_7$:$Eu^{2+}$,$Mn^{2+}$; $[Gd,Y,Lu,La]_2O_3$:$Eu^{3+}$,$Bi^{3+}$; $[Gd,Y,Lu,La]_2O_2S$:$Eu^{3+}$,$Bi^{3+}$; $[Gd,Y,Lu,La]VO_4$:$Eu^{3+}$,$Bi^{3+}$; $[Ca,Sr,Mg]S$:$Eu^{2+}$,$Ce^{3+}$; $SrY_2S_4$:$Eu^{2+}$; $CaLa_2S_4$:$Ce^{3+}$; $[Ba,Sr,Ca]MgP_2O_7$:$Eu^{2+}$,$Mn^{2+}$; $[Y,Lu]_2WO_6$:$Eu^{3+}$,$Mo^{6+}$; $[Ba,Sr,Ca]_bSi_gN_m$:$Eu^{2+}$ (wherein $2b+4g=3m$); $Ca_3(SiO_4)Cl_2$:$Eu^{2+}$; $[Lu,Sc,Y,Tb]_{2-u-v}Ce_vCa_{1+u}Li_wMg_{2-w}P_w[Si,Ge]_{3-w}O_{12-u/2}$ (where $0.5 \leq u \leq 1$, $0 \leq v \leq 0.1$, and $0 \leq w \leq 0.2$); $[Y,Lu,Gd]_{2-m}[Y,Lu,Gd]Ca_mSi_4N_{6+m}C_{1-m}$:$Ce^{3+}$, (wherein $0 \leq m \leq 0.5$); $[Lu,Ca,Li,Mg,Y]$, alpha-SiAlON doped with $Eu^{2+}$ and/or $Ce^{3+}$; $Sr(LiAl_3N_4)$:$Eu^{2+}$, $[Ca, Sr,Ba]SiO_2N_2$:$Eu^{2+}$,$Ce^{3+}$; beta-SiAlON:$Eu^{2+}$; $3.5MgO$*$0.5MgF_2$*$GeO_2$:$Mn^{4+}$; $Ca_{1-c-f}Ce_cEu_fAl_{1+c}Si_{1-c}N_3$, (where $0 \leq c \leq 0.2$, $0 \leq f \leq 0.2$); $Ca_{1-h-r}Ce_hEu_rAl_{1-h}(Mg,Zn)_hSiN_3$, (where $0 \leq h \leq 0.2$, $0 \leq r \leq 0.2$); $Ca_{1-2s-t}Ce_s[Li,Na]_sEu_tAlSiN_3$, (where $0 \leq s \leq 0.2$, $0 \leq t \leq 0.2$, $s+t \geq 0$); $[Sr,Ca]AlSiN_3$: $Eu^{2+}$,$Ce^{3+}$, and $Li_2CaSiO_4$:$Eu_{2+}$.

In particular embodiments, additional phosphors include: $[Y,Gd,Lu,Tb]_3[Al,Ga]_5O_{12}$:$Ce^{3+}$, $\beta$-SiAlON:$Eu^{2+}$, $[Sr,Ca,Ba][Ga,Al]_2S_4$:$Eu^{2+}$, $[Li,Ca]\alpha$-SiAlON:$Eu^{2+}$, $[Ba,Sr,Ca]_2Si_5N_8$:$Eu^{2+}$, $[Ca,Sr]AlSiN_3$:$Eu^{2+}$, $[Ba,Sr,Ca]LiAl_3N_4$:$Eu^{2+}$ and $[Sr,Ca,Mg]S$:$Eu^{2+}$.

The ratio of each of the individual phosphors in the phosphor composition may vary depending on the characteristics of the desired light output. The relative proportions of the individual phosphors in the various phosphor compositions may be adjusted such that when their emissions are blended and employed in a device, for example a lighting apparatus, there is produced visible light of predetermined x and y values on the CIE chromaticity diagram.

Other additional luminescent materials suitable for use in the phosphor composition may include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly(vinylcarbazole) and polyphenylenevinylene and their derivatives. In addition, the light emitting layer may include a blue, yellow, orange, green or red phosphorescent dye or metal complex, a quantum dot material, or a combination thereof. Materials suitable for use as the phosphorescent dye include, but are not limited to, tris(1-phenylisoquinoline) iridium (III) (red dye), tris(2-phenylpyridine) iridium (green dye) and iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE. Exemplary quantum dot materials are based on CdSe, ZnS or InP, including, but not limited to, core/shell luminescent nanocrystals such as CdSe/ZnS, InP/ZnS, PbSe/PbS, CdSe/CdS, CdTe/CdS or CdTe/ZnS. Other examples of the quantum dot materials include halide perovskite quantum dots such as $CsPbX_3$, where X is Cl, Br, I or a combination thereof. All of these semiconductor quantum dots may also have appropriate shells or coatings for passivation and/or environmental protection.

Devices according to the present disclosure include an LED light source radiationally coupled and/or optically coupled to one or more of the green-emitting phosphors. FIG. 1 shows a device 10, according to one embodiment of the present disclosure. The device 10 includes a LED light source 12 and a phosphor composition 14 including a green-emitting phosphor of the present disclosure. The LED light source 12 may be a UV or blue emitting LED. In some embodiments, the LED light source 12 produces blue light in a wavelength range from about 440 nm to about 460 nm. In the device 10, the phosphor composition 14 including the green-emitting phosphor as described herein, is radiationally coupled and/or optically coupled to the LED light source 12. Radiationally coupled or optically coupled means that radiation from the LED light source 12 is able to excite the phosphor composition 14, and the phosphor composition 14 is able to emit light in response to the excitation by the radiation. The phosphor composition 14 may be disposed on a part or portion of the LED light source 12 or located remotely at a distance from the LED light source 12.

The general discussion of the example LED light source discussed herein is directed toward an inorganic LED based light source. However, as used herein, the term is meant to encompass all LED light sources such as semiconductor laser diodes (LD), organic light emitting diodes (OLED) or a hybrid of LED and LD. In addition, the LED light source may be a miniLED or microLED, which may be used in self-emissive displays. Further, it should be understood that the LED light source may be replaced, supplemented or augmented by another radiation source unless otherwise noted and that any reference to semiconductor, semiconductor LED, or LED chip is merely representative of any appropriate radiation source, including, but not limited to, LDs and OLEDs. In some embodiments, the phosphor composition 14 further includes a red emitting phosphor of formula I, particularly $K_2SiF_6:Mn^{4+}$.

The phosphor composition 14 may be present in any form such as powder, glass, or composite e.g., phosphor-polymer composite or phosphor-glass composite. Further, the phosphor composition 14 may be used as a layer, sheet, strip, dispersed particulates, or a combination thereof. In some embodiments, the phosphor composition 14 includes the green-emitting phosphor in glass form. In some of these embodiments, the device 10 may include the phosphor composition 14 in form of a phosphor wheel (not shown). The phosphor wheel may include the green-emitting phosphor embedded in a glass. A phosphor wheel and related devices are described in WO 2017/196779.

Figure 2:
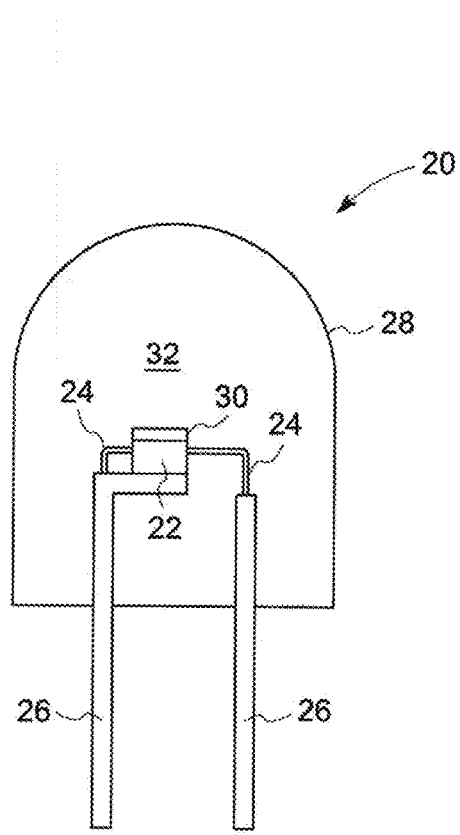
FIG. 2 is a schematic cross-sectional view of a lighting apparatus, in accordance with one embodiment of the disclosure.

FIG. 2 illustrates a lighting apparatus or lamp 20, in accordance with some embodiments. The lighting apparatus 20 includes an LED chip 22, and leads 24 electrically attached to the LED chip 22. The leads 24 may comprise thin wires supported by a thicker lead frame(s) 26 or the leads 24 may comprise self-supported electrodes and the lead frame may be omitted. The leads 24 provide current to LED chip 22 and thus cause it to emit radiation.

A layer 30 of a phosphor composition including the green-emitting phosphor is disposed on a surface of the LED chip 22. The phosphor layer 30 may be disposed by any appropriate method, for example, using a slurry prepared by mixing silicone and the phosphor composition. In one such method, a silicone slurry in which the phosphor composition particles are randomly suspended is placed around the LED chip 22. This method is merely exemplary of possible positions of the phosphor layer 30 and LED chip 22. The phosphor layer 30 may be coated over or directly on the light emitting surface of the LED chip 22 by coating and drying the slurry over the LED chip 22. The light emitted by the LED chip 22 mixes with the light emitted by the phosphor composition to produce desired emission.

With continued reference to FIG. 2, the LED chip 22 may be encapsulated within an envelope 28. The envelope 28 may be formed of, for example glass or plastic. The LED chip 22 may be enclosed by an encapsulant material 32. The encapsulant material 32 may be a low temperature glass, or a polymer or resin known in the art, for example, an epoxy, silicone, epoxy-silicone, acrylate or a combination thereof. In an alternative embodiment, the lighting apparatus 20 may only include the encapsulant material 32 without the envelope 28. Both the envelope 28 and the encapsulant material 32 should be transparent to allow light to be transmitted through those elements.

Figure 3:
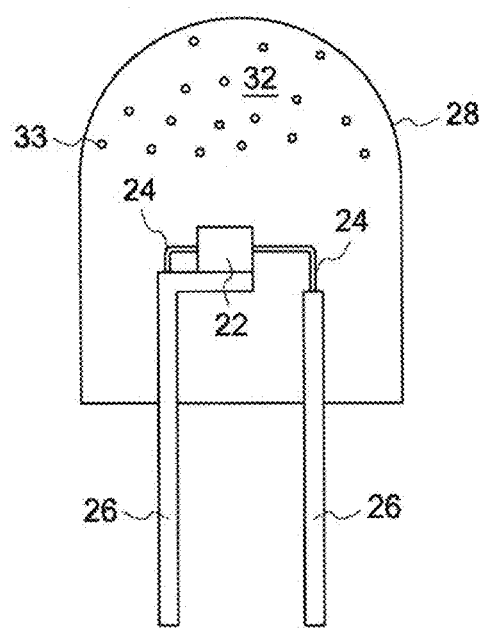
FIG. 3 is a schematic cross-sectional view of a lighting apparatus, in accordance with another embodiment of the disclosure.

In some embodiments as illustrated in FIG. 3, a phosphor composition 33 green-emitting phosphor is interspersed within the encapsulant material 32, instead of being formed directly on the LED chip 22, as shown in FIG. 2. The phosphor composition 33 may be interspersed within a portion of the encapsulant material 32 or throughout the entire volume of the encapsulant material 32. Blue light emitted by the LED chip 22 mixes with the light emitted by phosphor composition 33, and the mixed light transmits out from the lighting apparatus 20.

Figure 4:
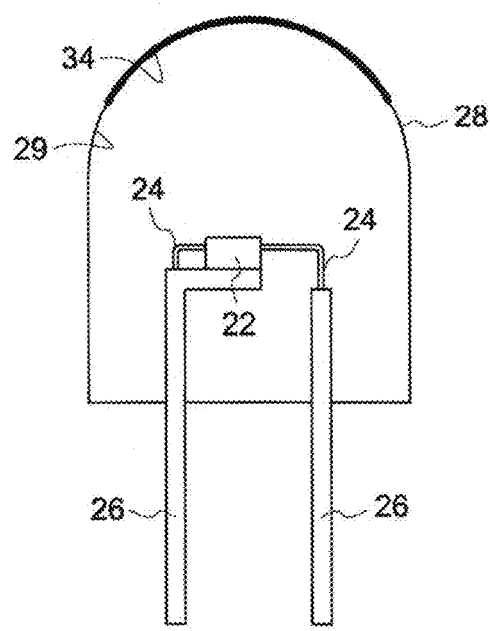
FIG. 4 is a cutaway side perspective view of a lighting apparatus, in accordance with one embodiment of the disclosure.

In yet another embodiment, a layer 34 of the phosphor composition including the green-emitting phosphor, is coated onto a surface of the envelope 28, instead of being formed over the LED chip 22, as illustrated in FIG. 4. As shown, the phosphor layer 34 is coated on an inside surface 29 of the envelope 28, although the phosphor layer 34 may be coated on an outside surface of the envelope 28, if desired. The phosphor layer 34 may be coated on the entire surface of the envelope 28 or only a top portion of the inside surface 29 of the envelope 28. The UV/blue light emitted by the LED chip 22 mixes with the light emitted by the phosphor layer 34, and the mixed light transmits out. Of course, the phosphor composition may be located in any two or all three locations (as shown in FIGS. 2-4) or in any other suitable location, such as separately from the envelope 28 or integrated into the LED chip 22.

In any of the above structures, the lighting apparatus 20 (FIGS. 2-4) may also include a plurality of scattering particles (not shown), which are embedded in the encapsulant material 32. The scattering particles may comprise, for example, alumina, silica, zirconia, or titania. The scattering particles effectively scatter the directional light emitted from the LED chip 22, preferably with a negligible amount of absorption.

Figure 5:
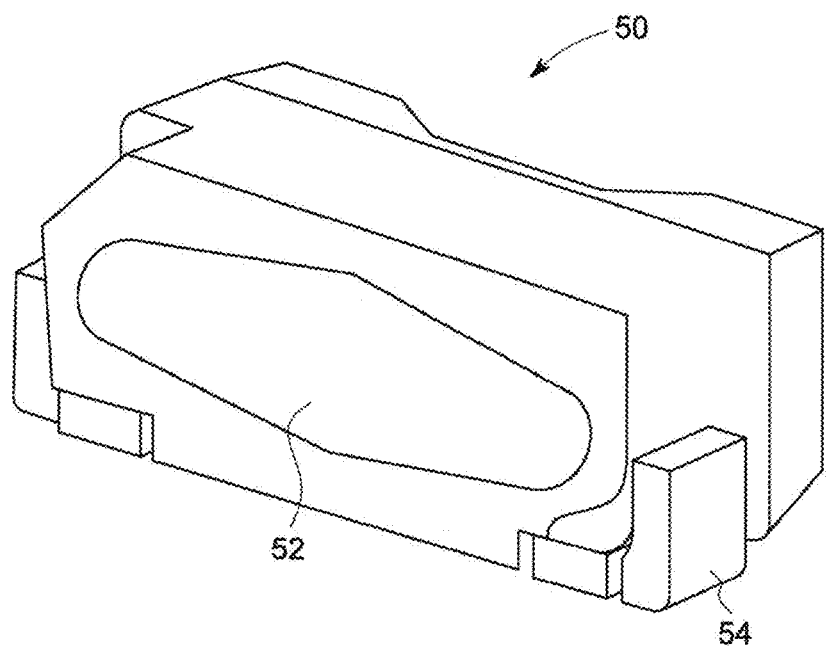
FIG. 5 is a schematic perspective view of a surface-mounted device (SMD), in accordance with one embodiment of the disclosure.

Some embodiments include a surface mounted device (SMD) type light emitting diode 50, e.g. as illustrated in FIG. 5, for backlight applications. This SMD is a "side-emitting type" and has a light-emitting window 52 on a protruding portion of a light guiding member 54. An SMD package may comprise an LED chip as defined above, and a phosphor composition including the green-emitting phosphor as described herein.

Devices of the present disclosure include lighting and display apparatuses for general illumination and display applications. Examples of display apparatuses include liquid crystal display (LCD) backlight units, televisions, computer monitors, laptops, mobile phones, smartphone, tablet computers and other handheld devices. Where the display is a backlight unit, the green-emitting phosphor may be incorporated in a sheet or strip that is radiationally coupled and/or optically coupled to the LED light source, as described in US Patent Application Publication No. 2017/0254943. Examples of other devices include chromatic lamps, plasma screens, xenon excitation lamps, UV excitation marking systems, automotive headlamps, home and theatre projectors, laser pumped devices, and point sensors.

By use of the phosphor compositions described herein, devices can be provided producing white light for display applications, for example, LCD backlight units, having high color gamut and high luminosity. Alternately, devices can be provided producing white light for general illumination having high luminosity and high CRT values for a wide range of color temperatures of interest (2500 K to 10000 K). The list of these applications is meant to be merely exemplary and not exhaustive.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

EXAMPLES

Example 1: Preparation of $BaMgUO_2(PO_4)_2$

Stoichiometric amounts of $BaCO_3$, MgO, $UO_2$ and $(NH_4)_2HPO_4$ (DAP) were weighed out into a Nalgene bottle and ball milled for two hours. After the mixture was thoroughly blended the powder was transferred into an alumina crucible and fired at 500° C. to decompose the DAP. The fired blend was then transferred back into the Nalgene bottle and milled for another two hours. After the second milling the powder was transferred back into the alumina crucible for firing at 1000-1100° C. After firing, a yellow colored powder of composition $BaMgUO_2(PO_4)_2$ was obtained.

Figure 6:
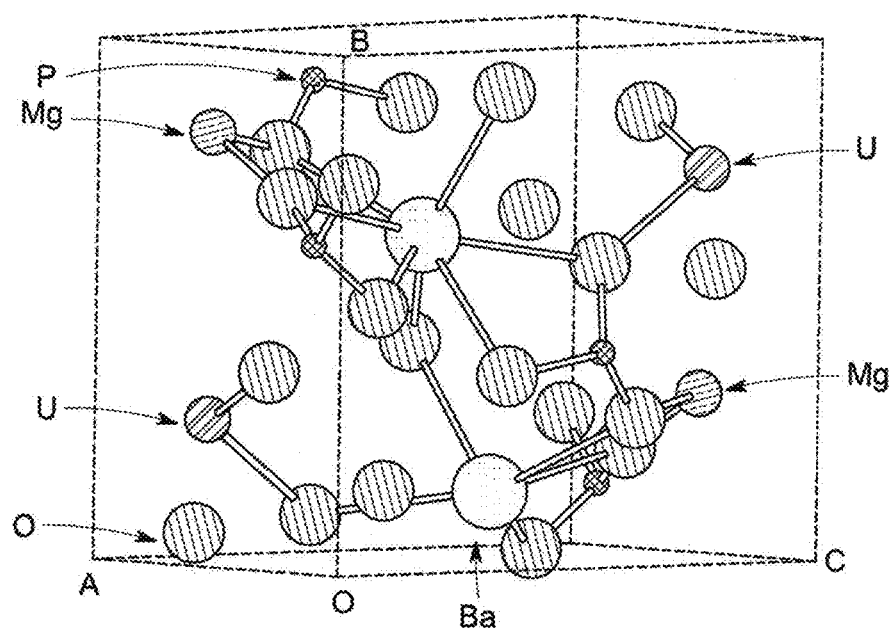
FIG. 6 shows the crystal structure of $BaMgUO_2(PO_4)_2$ as determined by x-ray diffraction (XRD) analysis.
Figure 7:
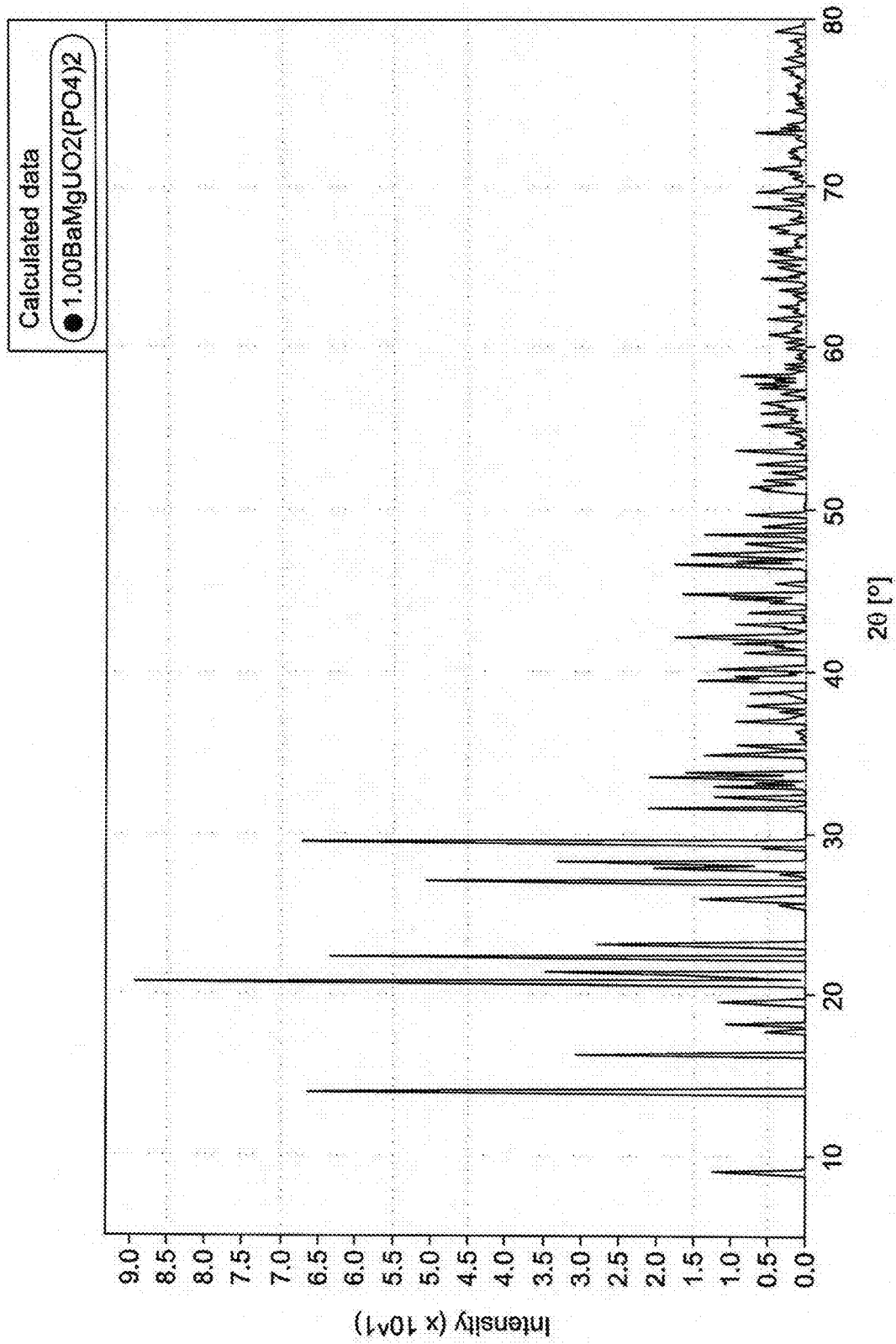
FIG. 7 shows the XRD powder pattern for $BaMgUO_2(PO_4)_2$.
Figure 8:
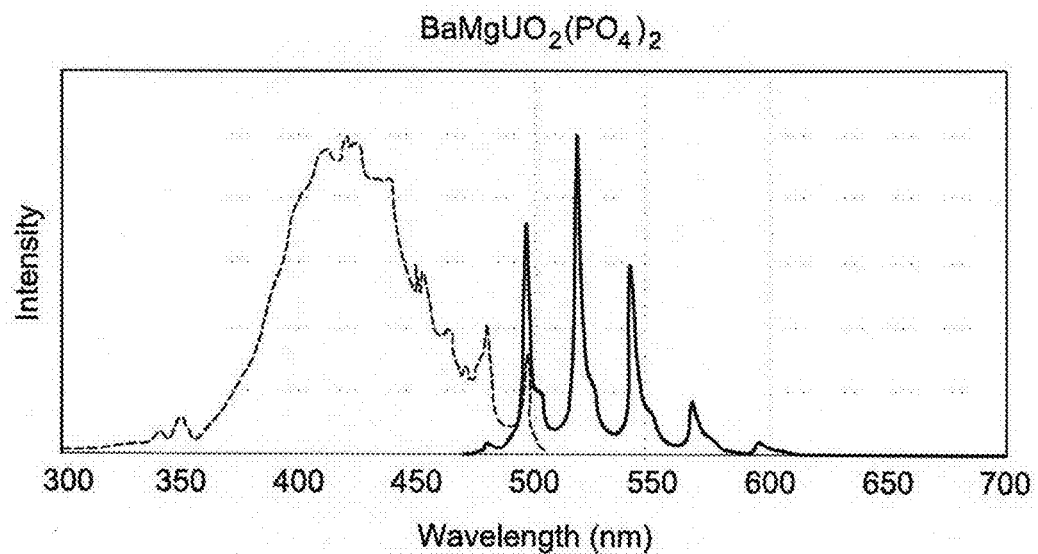
FIG. 8 shows an excitation spectrum (dotted) and an emission spectrum (solid) of a green emitting phosphor of formula $BaMgUO_2(PO_4)_2$.

The crystal structure of this material was solved and is shown in FIG. 6. The XRD powder pattern is shown in FIG. 7, and crystallographic data is shown in Table 1. The emission (solid line) and excitation (dotted line) spectra of $BaMgUO_2(PO_4)_2$ are shown in FIG. 8.

Example 2: Preparation of $BaZnUO_2(PO_4)_2$

Stoichiometric amounts of $BaCO_3$, ZnO, $UO_2$ and $(NH_4)_2HPO_4$ (DAP) were weighed out into a Nalgene bottle and ball milled for two hours. After the mixture was thoroughly blended the powder was transferred into an alumina crucible and fired at 500° C. to decompose the DAP. The fired blend was then transferred back into the Nalgene bottle and milled for another two hours. After the second milling the powder was transferred back into the alumina crucible for firing at 1000-1100° C. After firing a yellow colored powder of composition $BaZnUO_2(PO_4)_2$ was obtained.

Figure 9:
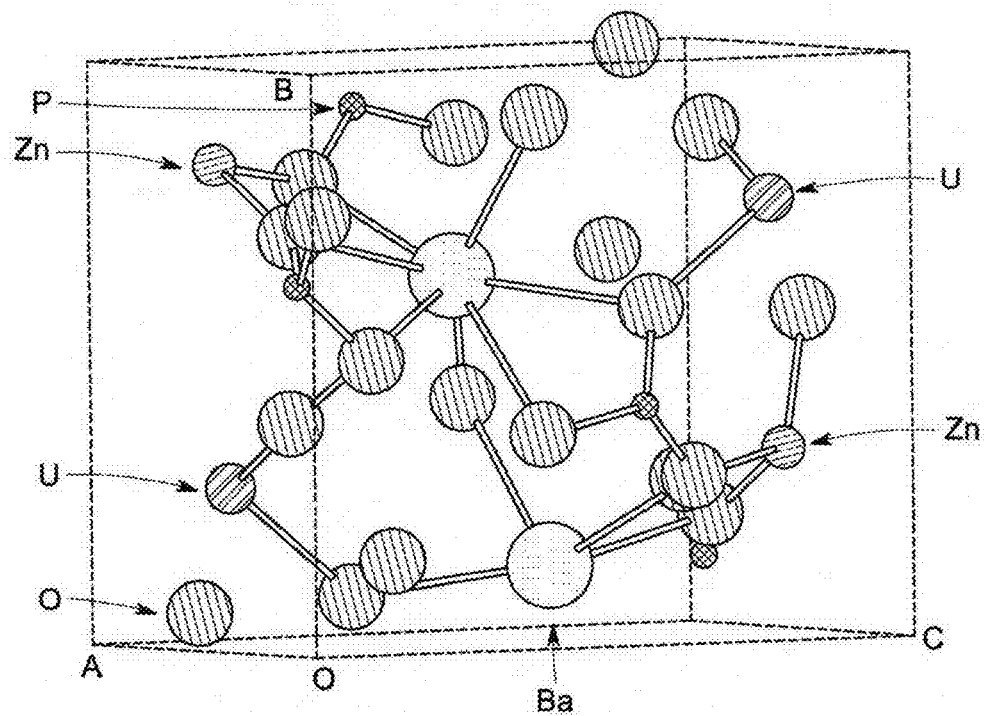
FIG. 9 shows the crystal structure of $BaZnUO_2(PO_4)_2$ as determined by x-ray diffraction (XRD) analysis.
Figure 10:
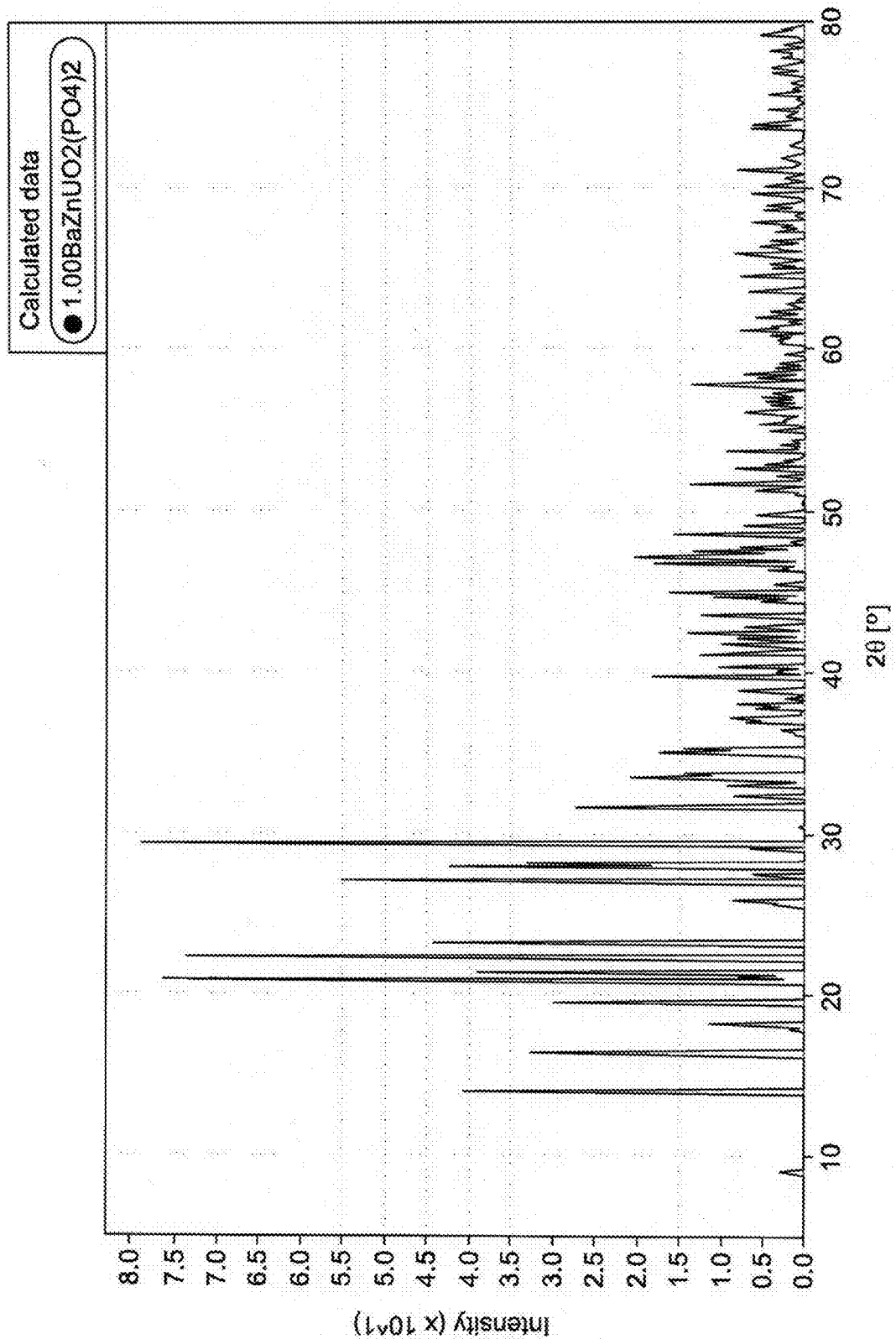
FIG. 10 shows the XRD powder pattern for $BaZnUO_2(PO_4)_2$.
Figure 11:
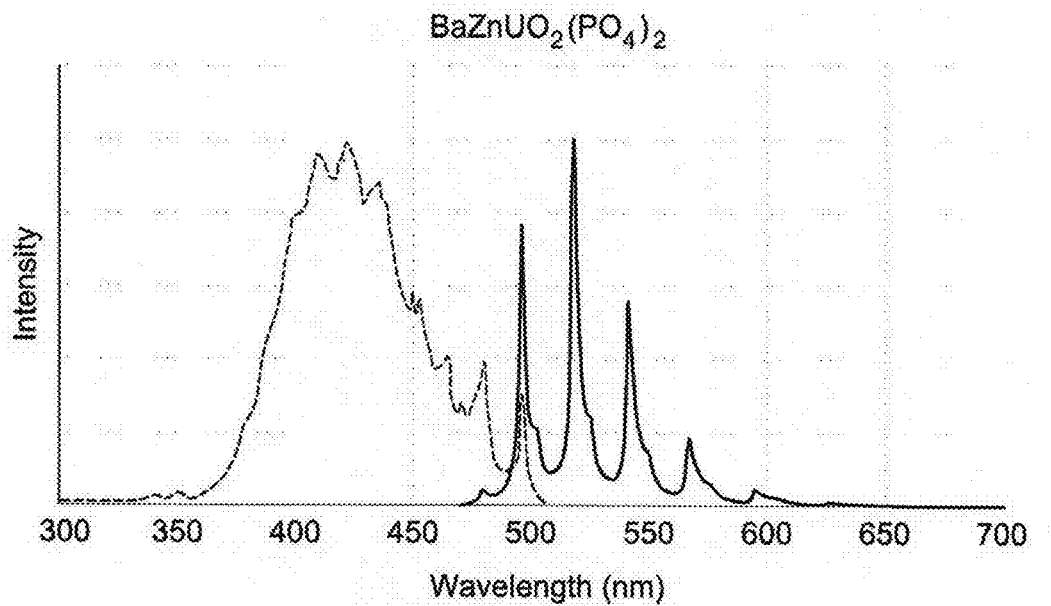
FIG. 11 shows an excitation spectrum (dotted) and an emission spectrum (solid) of a green emitting phosphor of formula $BaZnUO_2(PO_4)_2$.

The crystal structure of this material was solved and is shown in FIG. 9. The XRD powder pattern is shown in FIG. 10, and crystallographic data is shown in Table 1. Emission (solid line) and excitation spectra (dotted line) of $BaZnUO_2(PO_4)_2$ are shown in FIG. 11.

Example 3: Preparation of $Ba_3(PO_4)_2(UO_2)_2P_2O_7$

Stoichiometric amounts of $BaCO_3$, $UO_2$ and $(NH_4)_2HPO_4$ (DAP) were weighed out into a Nalgene bottle and ball milled for two hours. After the mixture was thoroughly blended the powder was transferred into an alumina crucible and fired at 500° C. to decompose the DAP. The fired blend was then transferred back into the Nalgene bottle and milled for another two hours. After the second milling the powder was transferred back into the alumina crucible for firing at 1000-1100° C. After firing a yellow body colored powder was obtained.

Figure 12:
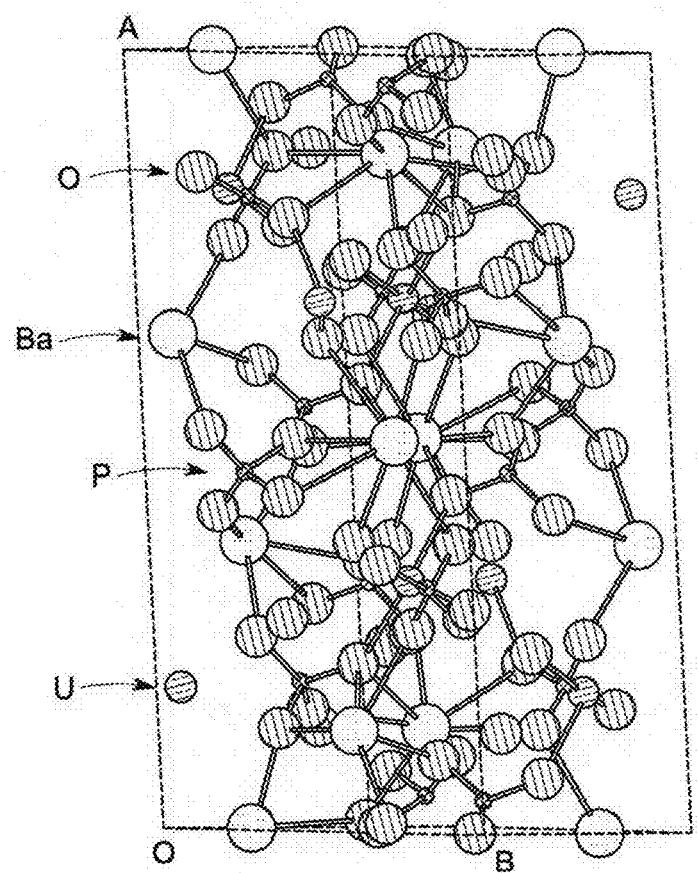
FIG. 12 shows the crystal structure of $Ba_3(PO_4)_2(UO_2)_2P_2O_7$ as determined by x-ray diffraction (XRD) analysis.
Figure 13:
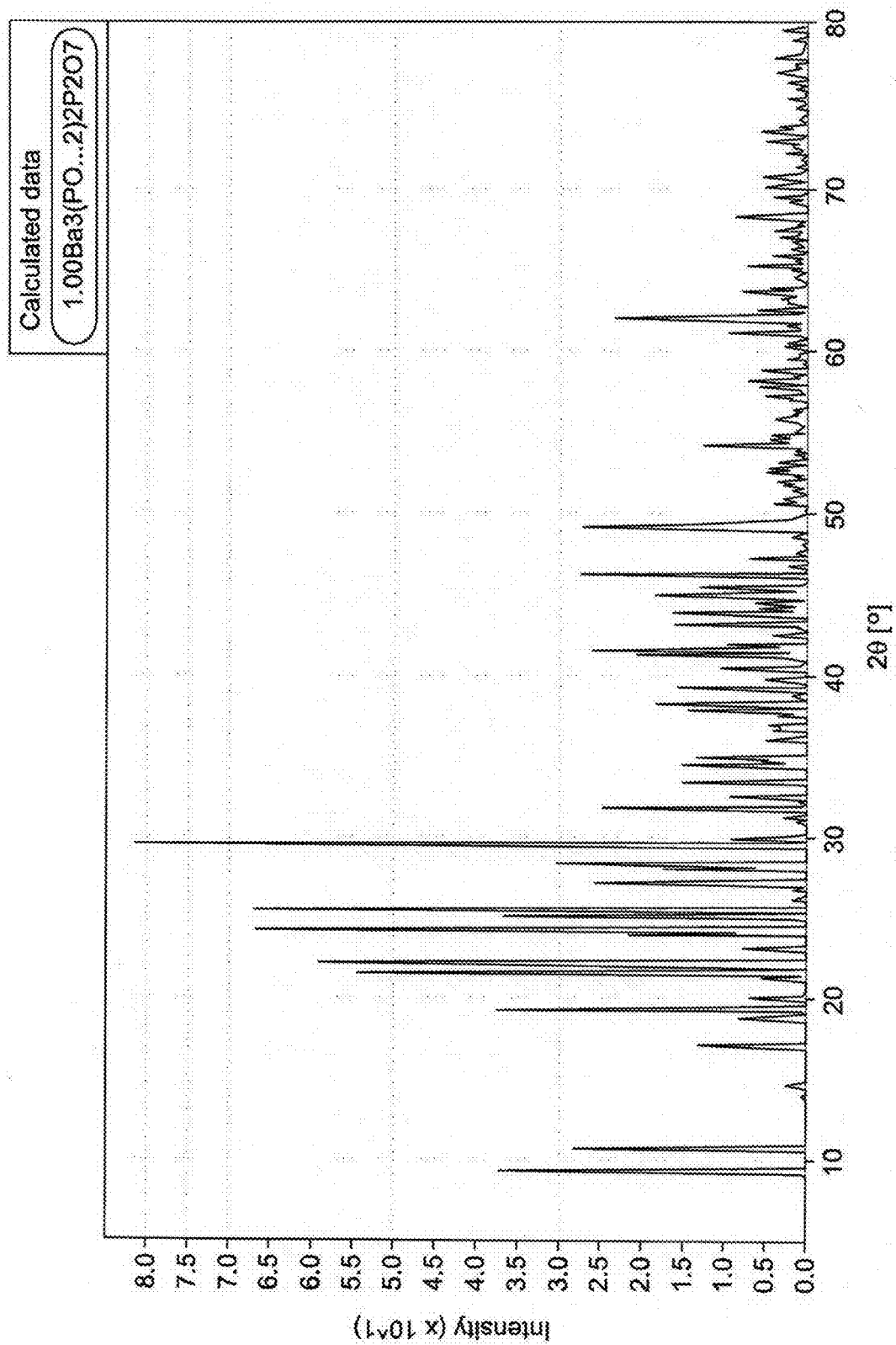
FIG. 13 shows the XRD powder pattern for $Ba_3(PO_4)_2(UO_2)_2P_2O_7$.
Figure 14:
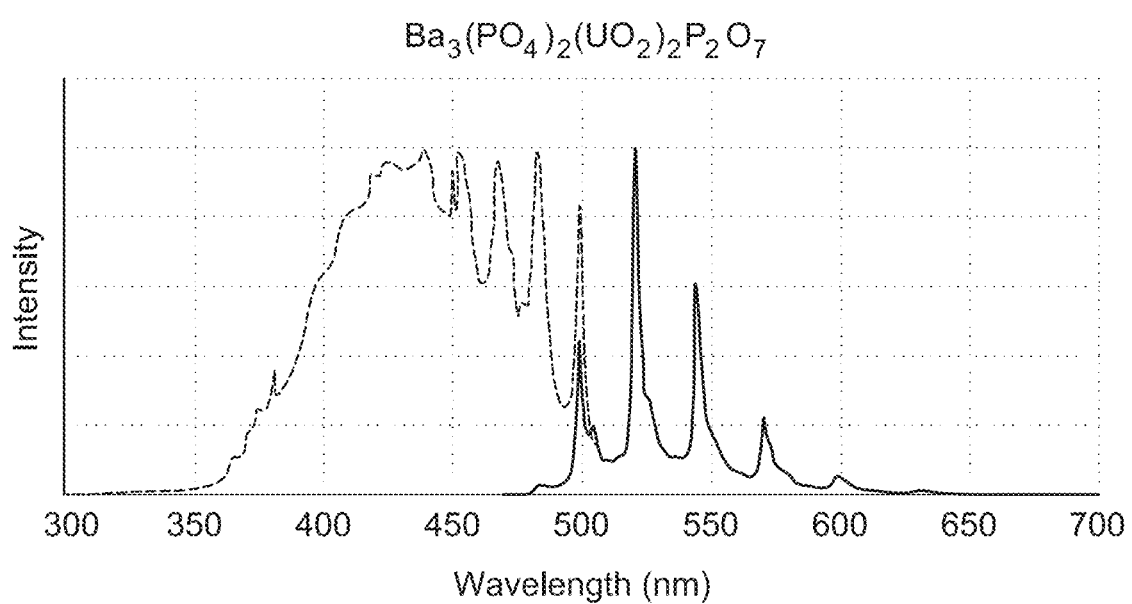
FIG. 14 shows an excitation spectrum (dotted) and an emission spectrum (solid) of a green emitting phosphor of formula $Ba_3(PO_4)_2(UO_2)_2P_2O_7$.

The crystal structure of this material was solved and is shown in FIG. 12. The XRD powder pattern is shown in FIG. 13, and crystallographic data is shown in Table 1. Emission (solid line) and excitation (dotted line) spectra of $Ba_3(PO_4)_2(UO_2)_2P_2O_7$ are shown in FIG. 14.

Example 4: Preparation of $\gamma\text{-}Ba_2UO_2(PO_4)$

Stoichiometric amounts of $BaHPO_4$, $UO_2$ and 5% excess $(NH_4)_2HPO_4$ (DAP) were weighed out into a Nalgene bottle and ball milled for two hours. After the mixture was thoroughly blended the powder was transferred into an alumina crucible and fired at 1100° C. to decompose the DAP. The fired blend was then transferred back into the Nalgene bottle and milled for another two hours. After the second milling the powder was transferred back into the alumina crucible for firing at 1200° C. After firing a yellow body colored powder was obtained.

Figure 15:
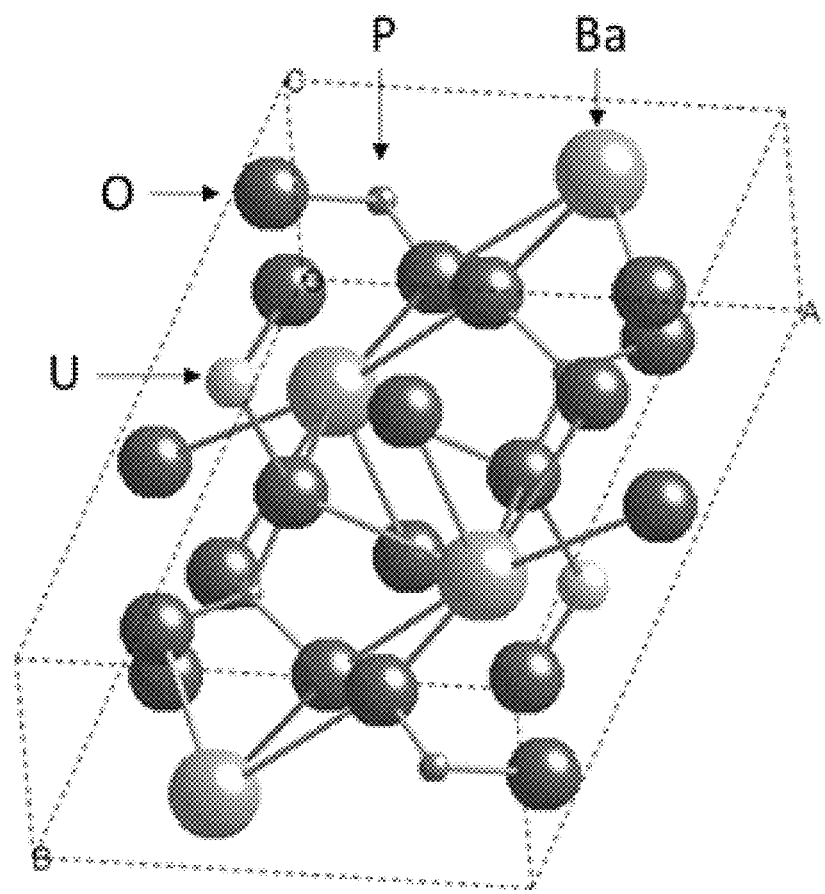
FIG. 15 shows the crystal structure of $\gamma$-$Ba_2UO_2(PO_4)_2$ as determined by x-ray diffraction (XRD) analysis.
Figure 16:
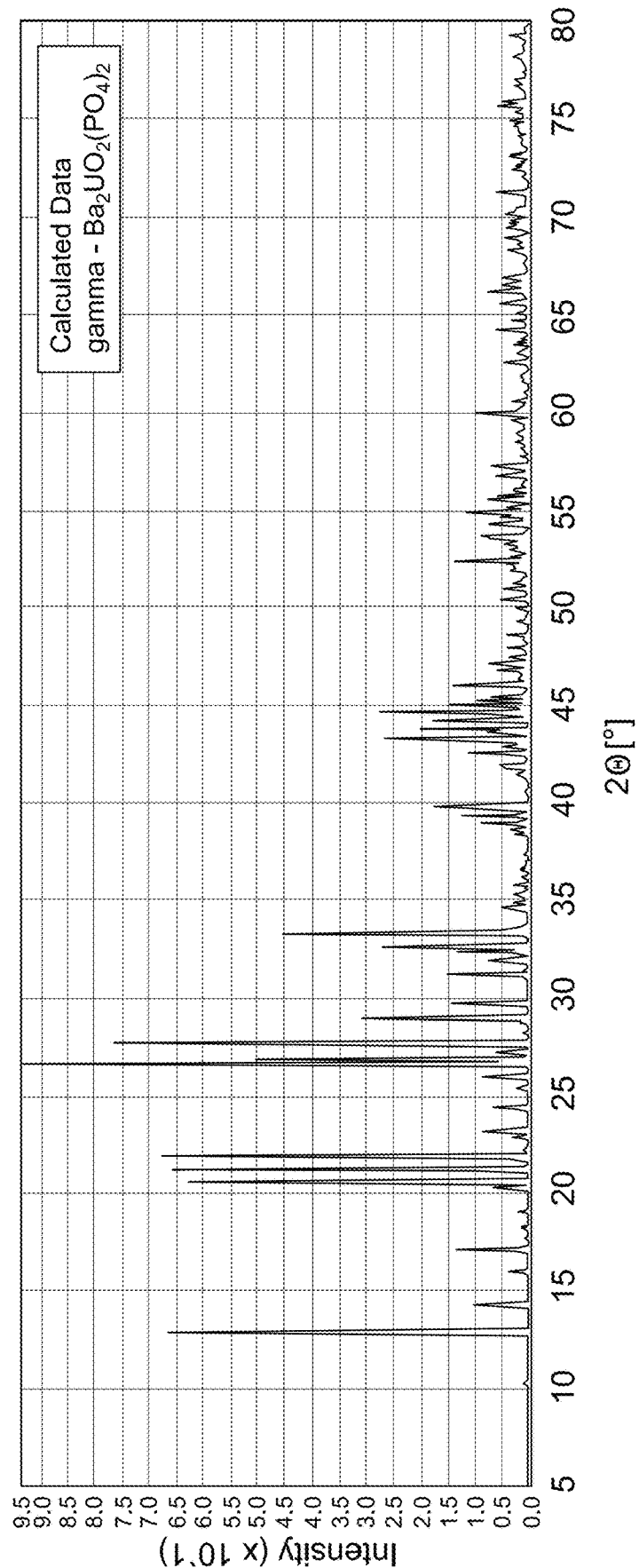
FIG. 16 shows the XRD powder pattern for $\gamma$-$Ba_2UO_2(PO_4)_2$.
Figure 17:
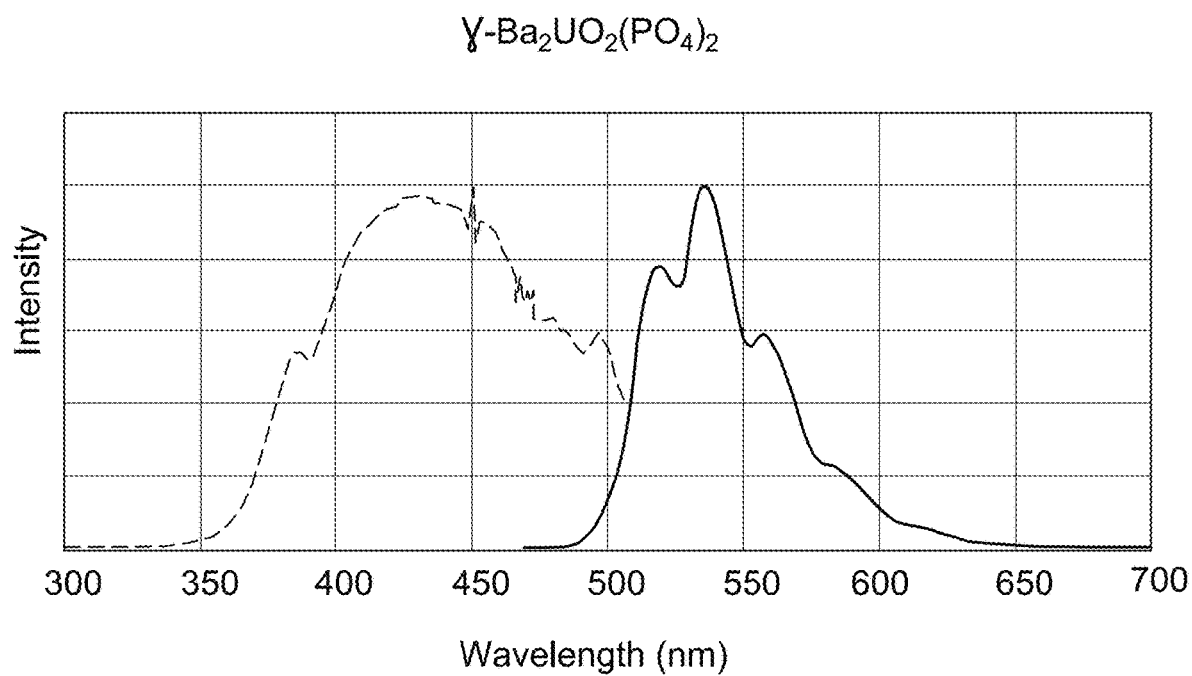
FIG. 17 shows an excitation spectrum (dotted) and an emission spectrum (solid) of a green emitting phosphor of formula $\gamma$-$Ba_2UO_2(PO_4)_2$.
Figure 18:
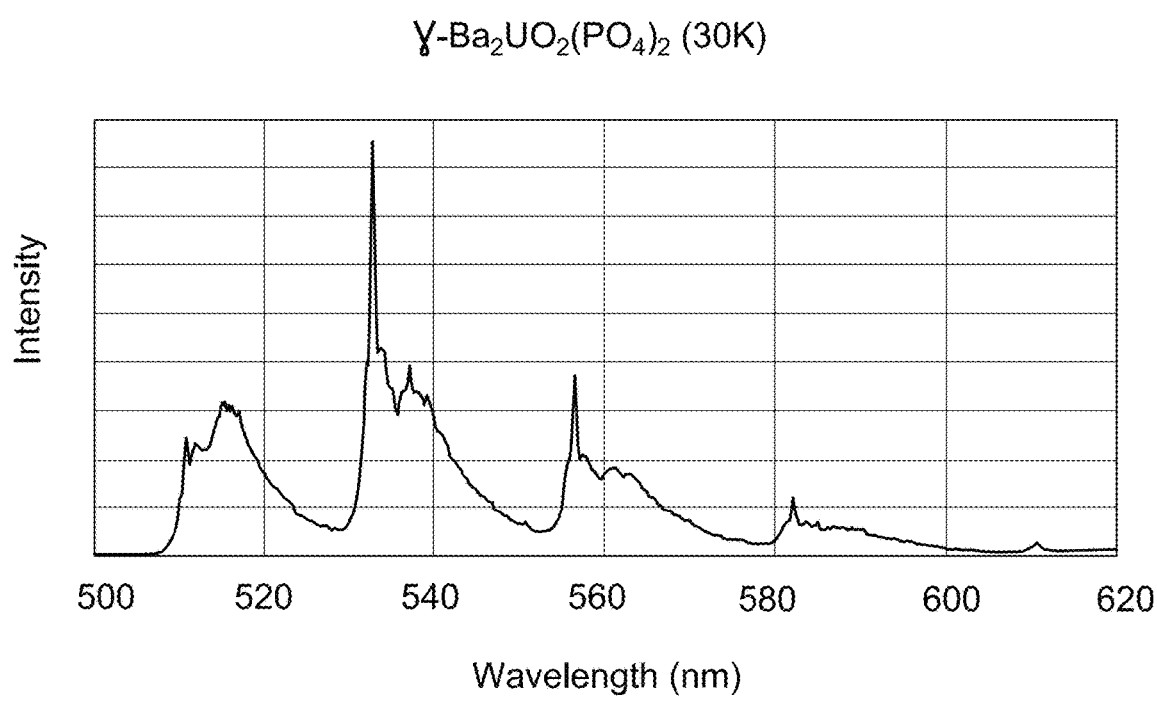
FIG. 18 shows an emission spectrum of a green-emitting phosphor of formula $\gamma$-$Ba_2UO_2(PO_4)_2$ at 30K.

The crystal structure of this material was solved and is shown in FIG. 15. The XRD powder pattern is shown in FIG. 16, and crystallographic data is shown in Table 1. Emission (solid line) and excitation (dotted line) spectra of $\gamma\text{-}Ba_2UO_2(PO_4)_2$ are shown in FIG. 17. An emission spectrum of $\gamma\text{-}Ba_2UO_2(PO_4)_2$ at 30K is shown in FIG. 18.

TABLE 1

| | Crystallographic Data | | | |
|---|---|---|---|---|
| | $BaZnUO_2(PO_4)_2$ | $BaMgUO_2(PO_4)_2$ | $Ba_3(PO_4)_2(UO_2)_2P_2O_7$ | $\gamma\text{-}Ba_2UO_2(PO_4)_2$ |
| Mol. Wt. | 662.69 | 621.61 | 1315.94 | 734.63 |
| Crystal System | Monoclinic | Monoclinic | Monoclinic | Triclinic |
| Space Group | $P2_1$ | $P2_1$ | C2/c | P-1 |
| a (Å) | 5.438 | 5.469 | 19.052 | 6.772 |
| b (Å) | 8.310 | 8.331 | 9.169 | 8.643 |
| c (Å) | 9.811 | 9.802 | 9.477 | 9.07 |
| α (deg) | 90 | 90 | 90 | 105.03 |

TABLE 1-continued

Crystallographic Data

|  | $BaZnUO_2(PO_4)_2$ | $BaMgUO_2(PO_4)_2$ | $Ba_3(PO_4)_2(UO_2)_2P_2O_7$ | $\gamma\text{-}Ba_2UO_2(PO_4)_2$ |
|---|---|---|---|---|
| β (deg) | 96.02 | 96.57 | 96.89 | 93.93 |
| γ (deg) | 90 | 90 | 90 | 111.40 |
| Vol. (Å³) | 440.9 | 443.7 | 1643.6 | 469.5 |
| Z | 2 | 2 | 4 | 2 |
| Den (g/cm³) | 4.990 | 4.652 | 5.317 | 5.196 |

Example 5: Preparation of $Ba_3(PO_4)_2(UO_2)_2P_2O_7$ $BaCl_2 \cdot 2H_2O$ (8.2001 g, 33.5686 mmol) and $UO_2(NO_3)_2 \cdot 6H_2O$ (2.9746 g, 5.9239 mmol) were added to a 250 mL beaker containing a large stir bar followed by 137 mL of deionized water. The starting mixture represents an 85/15 mole ratio of Ba and $UO_2$. The mixture was stirred at room temperature until it was homogeneous. A deionized water solution of ammonium hydrogen phosphate (11.12 mL, 3.5516 M, 39.4938 mmol) was added to the stirring solution over 15 minutes by syringe pump at room temperature. The mixture was stirred an additional 5 minutes and then filtered on a Buchner funnel. The light yellow powder was washed with deionized water (3×75 mL) with churning of the product before each wash. The $Ba/UO_2$ hydrogen phosphate intermediate (9.1059 g) was dried at room temperature.

The hydrogen phosphate intermediate (2.23 g) was fired in an alumina crucible at 1050° C. Single crystal x-ray diffraction analysis indicated that the heat-treated product comprises $Ba_3(PO_4)_2(UO_2)_2P_2O_7$.

Example 6: Preparation of $Ba_3(PO_4)_2(UO_2)_2P_2O_7$

Stoichiometric amounts of $Ba_3(PO_4)_2$, $UO_2(NO_3)_2 \cdot 6H_2O$ and DAP were blended in a Nalgene bottle with 20 mL of deionized (DI) $H_2O$ and ball milled (with yttria stabilized zirconia, YSZ media) for two hours. After blending the mixture was then filtered and dried to eliminate the excess water. Once dry the powder was crushed and placed in an alumina crucible for firing at 1000° C.-1100° C. in air for 5 hours. After firing a yellow body colored powder was obtained.

Example 7: Preparation of $Ba_3(PO_4)_2(UO_2)_2P_2O_7$ $\gamma\text{-}Ba_2UO_2(PO_4)_2$, $(UO_2)_3(PO_4)_2 \cdot 4H_2O$ and DAP were blended in a Nalgene bottle and ball milled (with YSZ media) for two hours. After the mixture was thoroughly blended the powder was transferred into an alumina crucible and fired at 1100° C. for 5 hours. After firing a yellow body colored powder was obtained. The phosphor material produced the same emission spectrum after excitation at 450 nm as shown in FIG. 14.

Example 8: Preparation of $Ba_3(PO_4)_2(UO_2)_2P_2O_7$ $\gamma\text{-}Ba_2UO_2(PO_4)_2$, $UO_2$ and DAP were blended in a Nalgene bottle and ball milled (with YSZ media) for two hours. After the mixture was thoroughly blended the powder was transferred into an alumina crucible and fired at 1100° C. for 5 hours. After firing a yellow body colored powder was obtained. The phosphor material produced the same emission spectrum after excitation at 450 nm as shown in FIG. 14.

Example 9: Preparation of $Ba_2Sr(PO_4)_2(UO_2)_2P_2O_7$

Figure 19:
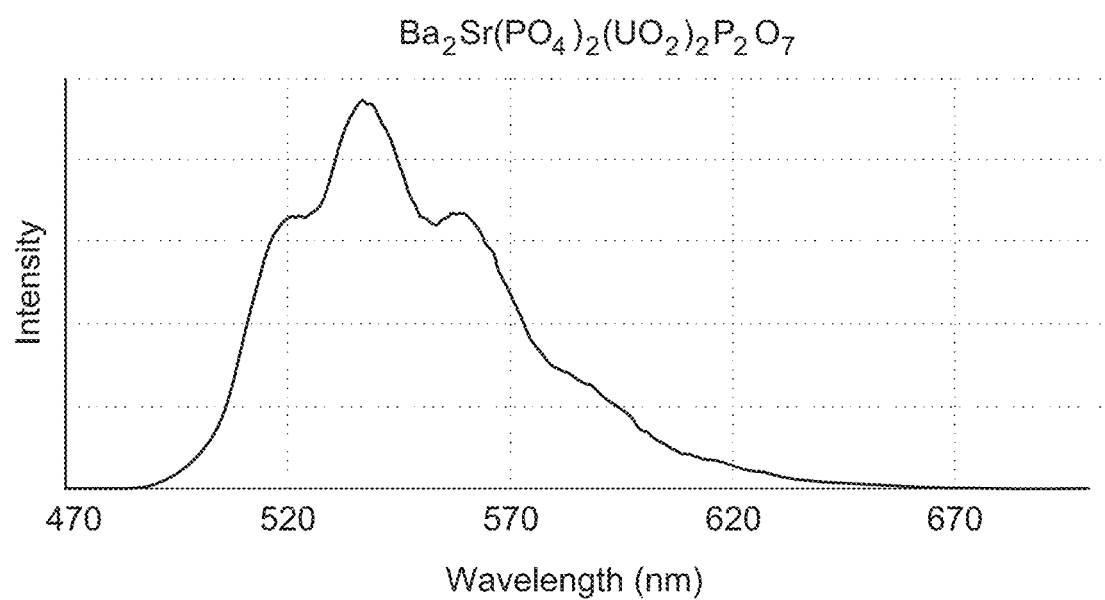
FIG. 19 shows an emission spectrum of a green emitting phosphor of formula $Ba_2Sr(PO_4)_2(UO_2)_2P_2O_7$.

Stoichiometric amounts of $BaCO_3$, $SrCO_3$ and $UO_2$, were blended with $(NH_4)_2HPO_4$ (DAP) (5% excess) in a Nalgene bottle and ball milled (with YSZ media) for two hours. After the mixture was thoroughly blended the powder was transferred into an alumina crucible and fired at 500° C. for 5 hours. After firing the powder was again blended for 2 hrs and fired at 1000° C.-1100° C. in air for 5 hours. After firing a yellow body colored powder was obtained. The emission spectrum after excitation at 450 nm is shown in FIG. 19.

Example 10: Preparation of $BaSr_2(PO_4)_2(UO_2)_2P_2O_7$

Figure 20:
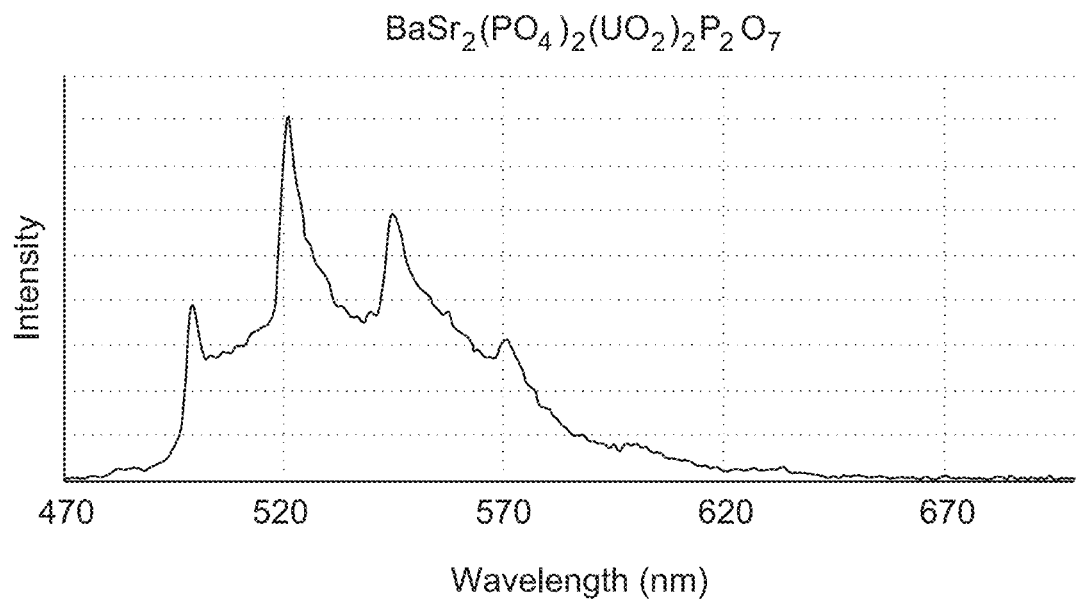
FIG. 20 shows an emission spectrum of a green emitting phosphor of formula $BaSr_2(PO_4)_2(UO_2)_2P_2O_7$.

Stoichiometric amounts of $BaCO_3$, $SrCO_3$ and $UO_2$, were blended with $(NH_4)_2HPO_4$ (DAP) (5% excess) in a Nalgene bottle and ball milled (with YSZ media) for two hours. After the mixture was thoroughly blended the powder was transferred into an alumina crucible and fired at 500° C. for 5 hours. After firing the powder was again blended for 2 hours and fired at 1000° C.-1100° C. in air for 5 hours. After firing a yellow body colored powder was obtained. The emission spectrum after excitation at 450 nm is shown in FIG. 20.

Example 11: Preparation of $Sr_3(PO_4)_2(UO_2)_2P_2O_7$

Figure 21:
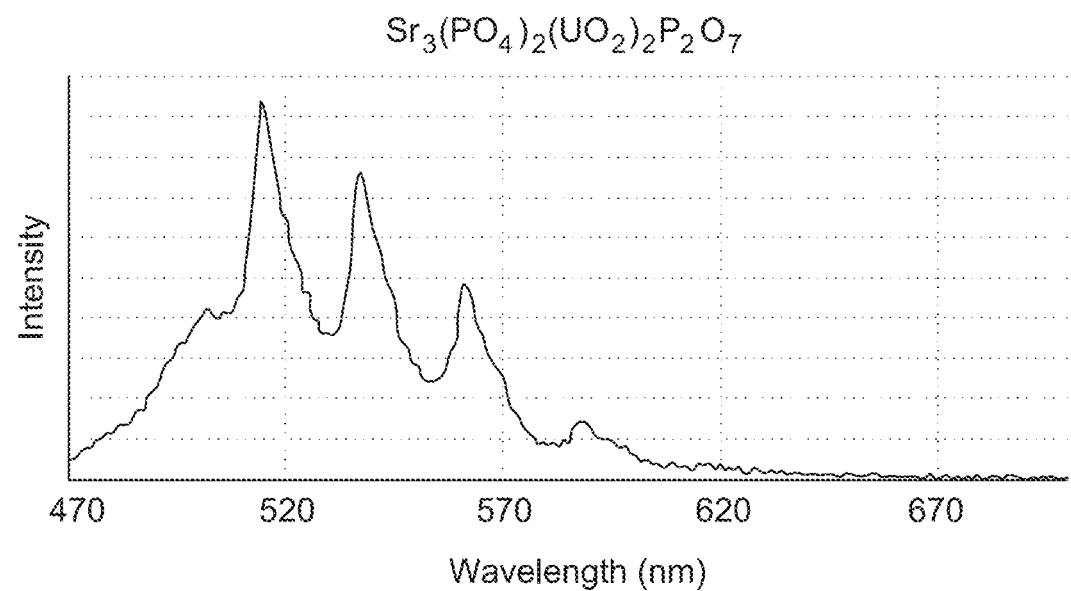
FIG. 21 shows an emission spectrum of a green emitting phosphor of formula $Sr_3(PO_4)_2(UO_2)_2P_2O_7$.

Stoichiometric amounts of $SrCO_3$ and $UO_2$, were blended with $(NH_4)_2HPO_4$ (DAP) (5% excess) in a Nalgene bottle and ball milled (with YSZ media) for two hours. After the mixture was thoroughly blended the powder was transferred into an alumina crucible and fired at 500° C. for 5 hours. After firing the powder was again blended for 2 hours and fired at 1000° C.-1100° C. in air for 5 hours. After firing a yellow body colored powder was obtained. The emission spectrum after excitation at 450 nm is shown in FIG. 21.

Example 12: Preparation of $Ca_3(PO_4)_2(UO_2)_2P_2O_7$

Figure 22:
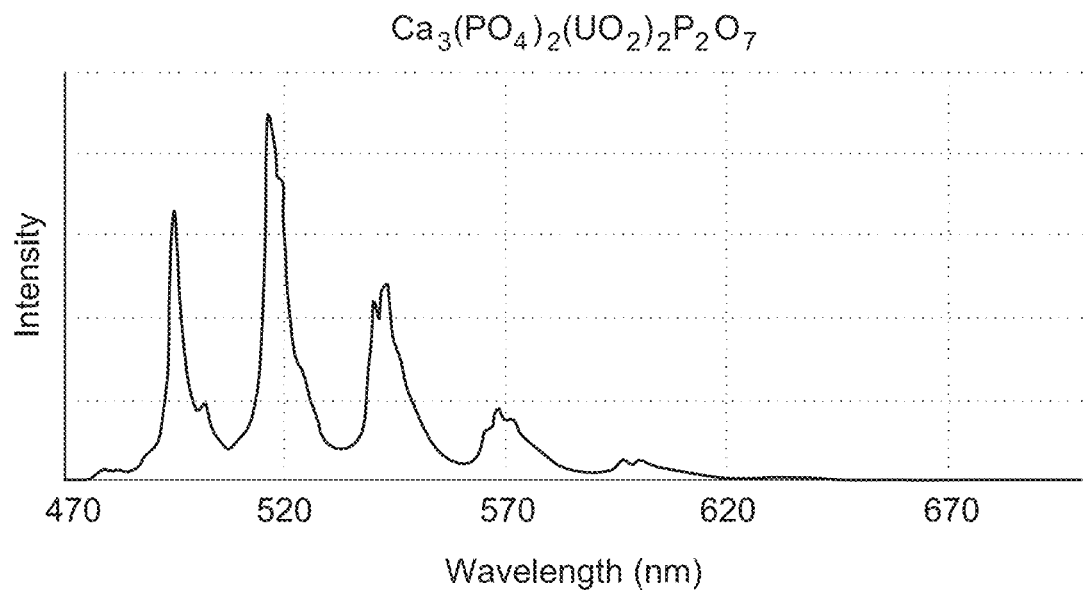
FIG. 22 shows an emission spectrum of a green emitting phosphor of formula $Ca_3(PO_4)_2(UO_2)_2P_2O_7$.

Stoichiometric amounts of $CaCO_3$ and $UO_2$, were blended with $(NH_4)_2HPO_4$ (DAP) (5% excess) in a Nalgene bottle and ball milled (with YSZ media) for two hours. After the mixture was thoroughly blended the powder was transferred into an alumina crucible and fired at 500° C. for 5 hrs. After firing the powder was again blended for 2 hrs and fired at 1000° C.-1100° C. in air for 5 hrs. After firing a yellow body colored powder was obtained. The emission spectrum after excitation at 450 nm is shown in FIG. 22.

Example 13: Preparation of $BaMg_2(PO_4)_2(UO_2)_2P_2O_7$

Figure 23:
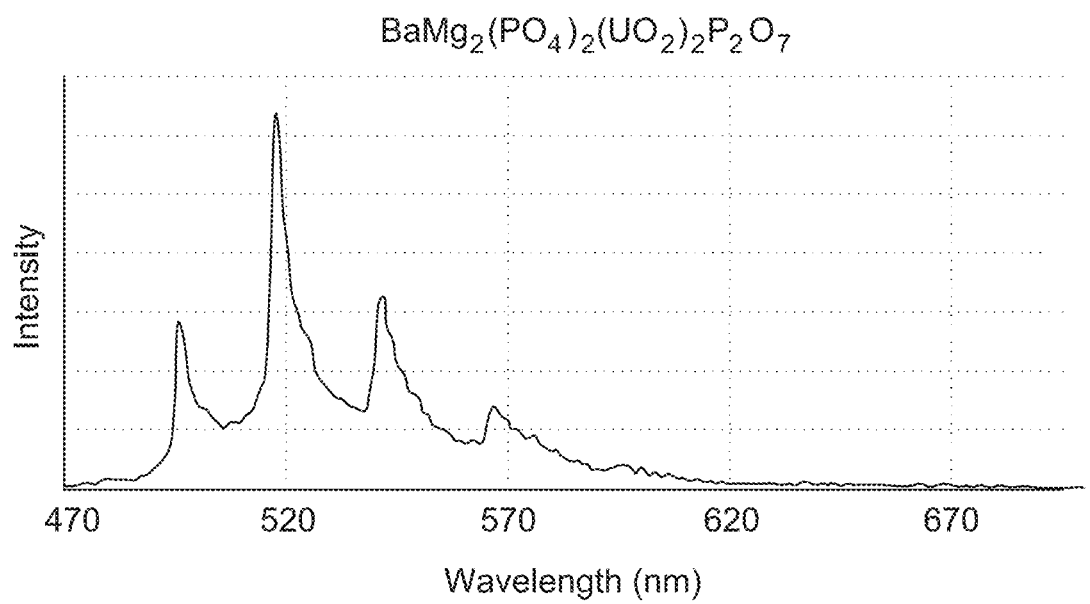
FIG. 23 shows an emission spectrum of a green emitting phosphor of formula $BaMg_2(PO_4)_2(UO_2)_2P_2O_7$.

Stoichiometric amounts of $BaCO_3$, MgO and $UO_2$ were blended with $(NH_4)_2HPO_4$ (DAP) (5% excess) in a Nalgene bottle and ball milled (with YSZ media) for two hours. After the mixture was thoroughly blended the powder was transferred into an alumina crucible and fired at 500° C. for 5 hours. After firing the powder was again blended for 2 hours and fired at 1000° C.-1100° C. in air for 5 hours. After firing a yellow body colored powder was obtained. The emission spectrum after excitation at 450 nm is shown in FIG. 23.

Example 14: Preparation of $Ba_2Mg(PO_4)_2(UO_2)_2P_2O_7$

Figure 24:
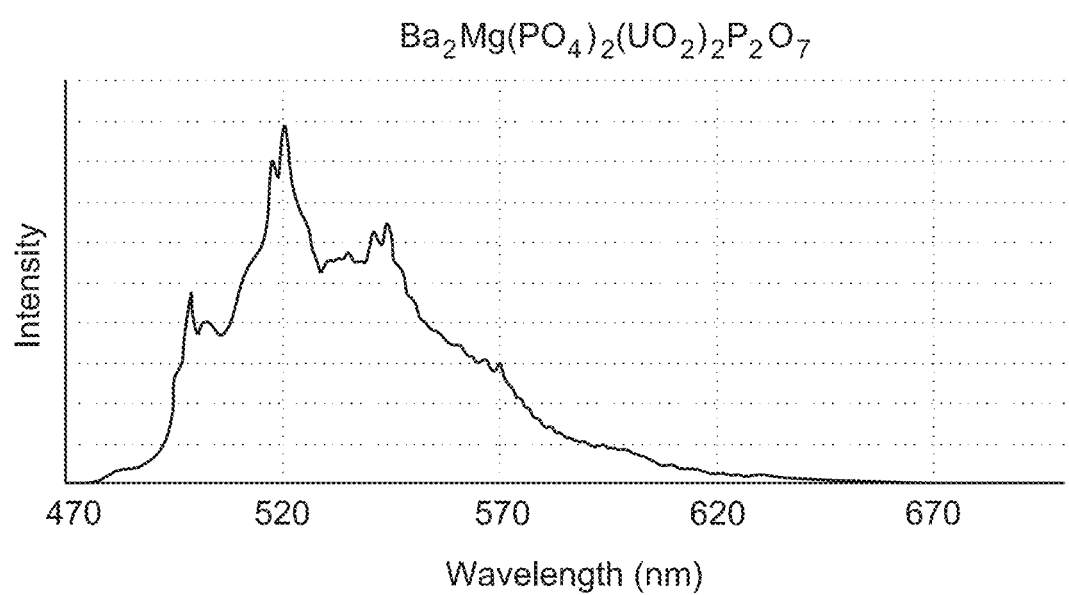
FIG. 24 shows an emission spectrum of a green emitting phosphor of formula $Ba_2Mg(PO_4)_2(UO_2)_2P_2O_7$.

Stoichiometric amounts of $BaCO_3$, MgO and $UO_2$, were blended with $(NH_4)_2HPO_4$ (DAP) (5% excess) in a Nalgene bottle and ball milled (with YSZ media) for two hours. After the mixture was thoroughly blended the powder was transferred into an alumina crucible and fired at 500° C. for 5 hours. After firing the powder was again blended for 2 hours and fired at 1000° C.-1100° C. in air for 5 hours. After firing a yellow body colored powder was obtained. The emission spectrum after excitation at 450 nm is shown in FIG. 24.

Example 15: Preparation of $Ba_2UO_2(VO_4)_2$

Figure 25:
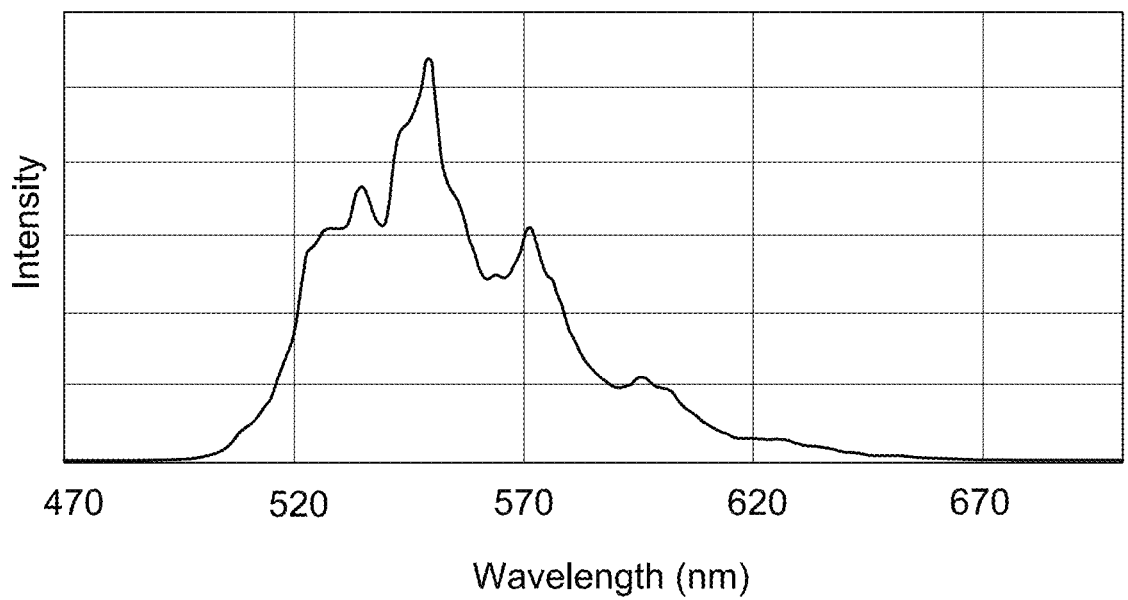
FIG. 25 shows an emission spectrum of formula $Ba_2UO_2(VO_4)_2$.

Stoichiometric amounts of $BaCO_3$, $NH_4VO_3$ and $UO_2$, were blended in a Nalgene bottle and ball milled (with YSZ media) for two hours. After the mixture was thoroughly blended the powder was transferred into an alumina crucible and fired at 500° C. for 5 hours. After firing the powder was again blended for 2 hours and fired at 1000° C.-1100° C. in air for 5 hours. After firing a yellow body colored powder was obtained. The emission spectrum after excitation at 450 nm is shown in FIG. 25.

Example 16: Preparation of $\gamma$-$Ba_2UO_2(PO_4)_2$:$Eu^{3+}$

Figure 26:
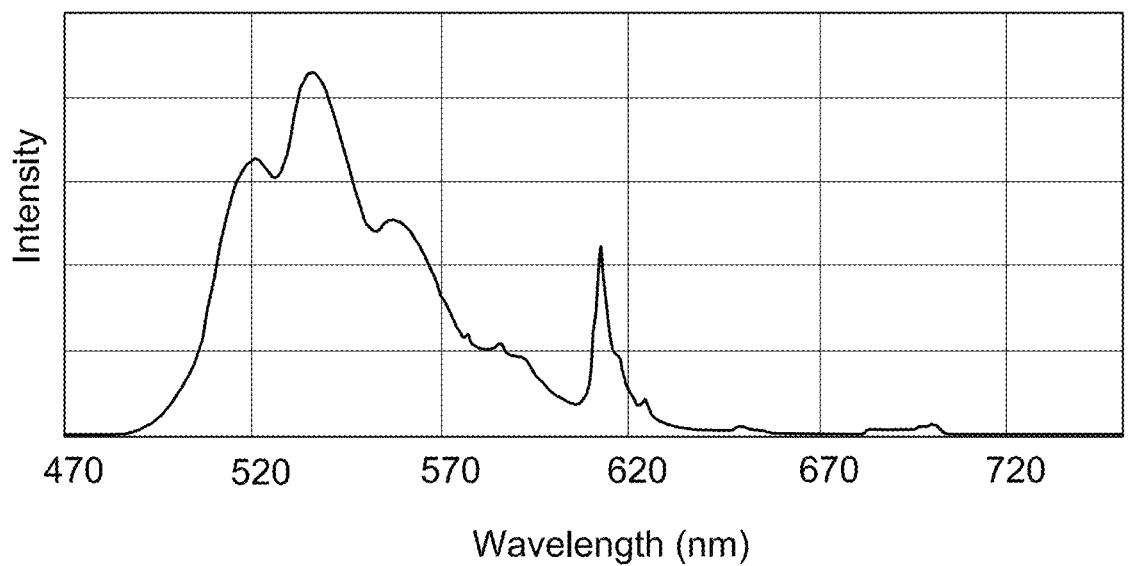
FIG. 26 shows an emission spectrum of formula $\gamma\text{-}Ba_2UO_2(PO_4)_2$ co-doped with $Eu^{3+}$ at room temperature.

Stoichiometric amounts of $BaCO_3$, $UO_2$, $Eu_2O_3$ and $(NH_4)_2HPO_4$ (DAP) (5% excess) were blended in a Nalgene bottle and ball milled (with YSZ media) for two hours. After the mixture was thoroughly blended the powder was transferred into an alumina crucible and fired at 500° C. for 5 hours. After firing the powder was again blended for 2 hours and fired at 1100° C.-1200° C. in air for 5 hours. After firing a yellow body colored powder was obtained. The emission spectrum after excitation at 450 nm at room temperature is shown in FIG. 26.

Example 17: Gamut Coverage of Phosphor Blends

Blend simulations using (u,v) or (x,y) color space were calculated using the spectra of a 450 nm blue LED and PFS ($K_2SiF_6$:$Mn^{4+}$) passing through standard LCD color filters. The color filter (CF) set and optical density of the CF set were kept constant, so that the results of the modeling only showed the effect of changing the green phosphor. The blend ratios of the LED and green and red phosphors were varied so that the output of the emission after going through the optical stack and color filter set were at the same D65 color point and then gamut area coverages were calculated. Results are shown in Table 2.

TABLE 2

| Green Phosphor | Adobe (%) | DCI (%) | BT2020 (%) | NTSC (%) |
|---|---|---|---|---|
| (u, v) | | | | |
| $\beta$-SiAlON:$Eu^{2+}$ | 87 | 93 | 80 | 84 |
| $BaZnUO_2(PO_4)_2$ | 100 | 98 | 88 | 97 |
| $BaMgUO_2(PO_4)_2$ | 100 | 98 | 88 | 97 |
| $Ba_3(PO_4)_2(UO_2)_2P_2O_7$ | 98 | 99 | 87 | 95 |
| $\gamma$-$Ba_2UO_2(PO_4)_2$ | 94 | 99 | 85 | 91 |
| (x, y) | | | | |
| $\beta$-SiAlON:$Eu^{2+}$ | 82 | 90 | 70 | 80 |
| $BaZnUO_2(PO_4)_2$ | 100 | 95 | 83 | 97 |
| $BaMgUO_2(PO_4)_2$ | 100 | 95 | 83 | 97 |
| $Ba_3(PO_4)_2(UO_2)_2P_2O_7$ | 97 | 98 | 81 | 95 |
| $\gamma$-$Ba_2UO_2(PO_4)_2$ | 91 | 100 | 80 | 90 |

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A green-emitting phosphor selected from
   $[Ba_{1-a-b}Sr_aCa_b]_x[Mg,Zn]_y(UO_2)_z([P,V]O_4)_{2(x+y+z)/3}$,
   where $0 \leq a \leq 1$, $0 \leq b \leq 1$, $0.75 \leq x \leq 1.25$, $0.75 \leq y \leq 1.25$, $0.75 \leq z \leq 1.25$; and
   $[Ba,Sr,Ca,Mg,Zn]_p(UO_2)_q[P,V]_rO_{(2p+2q+5r)/2}$,
   where $2.5 \leq p \leq 3.5$, $1.75 \leq q \leq 2.25$, $3.5 \leq r \leq 4.5$.

2. The green-emitting phosphor according to claim 1, of formula $Ba[Mg,Zn]UO_2(PO_4)_2$.

3. The green-emitting phosphor according to claim 1, of formula $BaMgUO_2(PO_4)_2$.

4. The green-emitting phosphor according to claim 1, of formula $BaZnUO_2(PO_4)_2$.

5. The green-emitting phosphor according to claim 1, of formula $Ba_3(PO_4)_2(UO_2)_2P_2O_7$.

6. The green-emitting phosphor according to claim 1, of formula $\gamma$-$Ba_2UO_2(PO_4)_2$.

7. The green-emitting phosphor according to claim 6, wherein $\gamma$-$Ba_2UO_2(PO_4)_2$ is co-doped with $Eu^{3+}$.

8. A phosphor composition comprising a green-emitting phosphor and a red-emitting phosphor; wherein the green-emitting phosphor is selected from
   $[Ba_{1-a-b}Sr_aCa_b]_x[Mg,Zn]_y(UO_2)_z([P,V]O_4)_{2(x+y+z)/3}$,
   where $0 \leq a \leq 1$, $0 \leq b \leq 1$, $0.75 \leq x \leq 1.25$, $0.75 \leq y \leq 1.25$, $0.75 \leq z \leq 1.25$; and
   $[Ba,Sr,Ca,Mg,Zn]_p(UO_2)_q[P,V]_rO_{(2p+2q+5r)/2}$,
   where $2.5 \leq p \leq 3.5$, $1.75 \leq q \leq 2.25$, and $3.5 \leq r \leq 4.5$; and
   the red-emitting phosphor is selected from
   $[Ba,Sr,Ca]_2Si_5N_8$:$Eu^{2+}$;
   $[Ca,Sr]AlSiN_3$:$Eu^{2+}$;
   $[Ba,Sr,Ca]LiAl_3N_4$:$Eu^{2+}$;
   $[Sr,Ca,Mg]S$:$Eu^{2+}$; and
   a phosphor of formula I $A_xMf_y$:$Mn^{4+}I$ wherein
   A is Li, Na, K, Rb, Cs, or a combination thereof;
   M is Si, Ge, Sn, Ti, Zr, Al, Ga, In, Sc, Hf, Y, La, Nb, Ta, Bi, Gd, or a combination thereof;
   x is an absolute value of a charge of the $MF_y$ ion; and
   y is 5, 6 or 7.

9. The phosphor composition according to claim 6, wherein the phosphor of formula I is $K_2SiF_6$:$Mn^{4+}$ or $Na_2SiF_6$:$Mn^{4+}$.

10. A device comprising an LED light source radiationally and/or optically coupled to a green-emitting phosphor selected from $[Ba_{1-a-b}Sr_aCa_b]_x[Mg,Zn]_y(UO_2)_z([P,V]O_4)_{2(x+y+z)/3}$, where $0 \leq a \leq 1$, $0 \leq b \leq 1$, $0.75 \leq x \leq 1.25$, $0.75 \leq y \leq 1.25$, $0.75 \leq z \leq 1.25$; and $[Ba,Sr,Ca,Mg,Zn]_p(UO_2)_q[P,V]_rO_{(2p+2q+5r)/2}$, where $2.5 \leq p \leq 3.5$, $1.75 \leq q \leq 2.25$, $3.5 \leq r \leq 4.5$.

11. The device according to claim 10, additionally comprising a red-emitting phosphor selected from $(Ba,Sr,Ca)_2Si_5N_8$:$Eu^{2+}$;

$(Ca,Sr)AlSiN_3$:$Eu^{2+}$;

$(Ba,Sr,Ca)LiAl_3N_4$:$Eu^{2+}$;

$(Sr,Ca,Mg)S$:$Eu^{2+}$; and a phosphor of formula I $A_xMf_y$:$Mn^{4+}$

I wherein

A is Li, Na, K, Rb, Cs, or a combination thereof;

M is Si, Ge, Sn, Ti, Zr, Al, Ga, In, Sc, Hf, Y, La, Nb, Ta, Bi, Gd, or a combination thereof;

x is an absolute value of a charge of the $MF_y$ ion; and y is 5, 6 or 7.

12. A device according to claim 10, wherein the phosphor of formula I is $K_2SiF_6$:$Mn^{4+}$ or $Na_2SiF_6$:$Mn^{4+}$.

13. The device according to claim 10, additionally comprising a quantum dot material.

14. A lighting apparatus comprising the device of claim 10.

15. A display apparatus comprising the device of claim 10.

16. The device according to claim 10, wherein the LED light source is a mini LED or a micro LED.

17. A television comprising the device of claim 10.

18. A mobile phone comprising the device of claim 10.

19. A computer monitor comprising the device of claim 10.

20. The green-emitting phosphor according to claim 1, wherein the phosphor has the formula selected from the group consisting of: $Ba_2Sr(PO_4)_2(UO_2)_2P_2O_7$, $BaSr_2(PO_4)_2(UO_2)_2P_2O_7$, $Sr_3(PO_4)_2(UO_2)_2P_2O_7$, $Ca_3(PO_4)_2(UO_2)_2P_2O_7$, $BaMg_2(PO_4)_2(UO_2)_2P_2O_7$, $Ba_2Mg(PO_4)_2(UO_2)_2P_2O_7$, and $Ba_2UO_2(VO_4)_2$.

* * * * *